United States Patent
Habermehl et al.

(10) Patent No.: US 6,174,820 B1
(45) Date of Patent: Jan. 16, 2001

(54) USE OF SILICON OXYNITRIDE AS A SACRIFICIAL MATERIAL FOR MICROELECTROMECHANICAL DEVICES

(75) Inventors: Scott D. Habermehl, Corrales; Jeffry J. Sniegowski, Edgewood, both of NM (US)

(73) Assignee: Sandia Corporation, Albuquerque, NM (US)

( * ) Notice: Under 35 U.S.C. 154(b), the term of this patent shall be extended for 0 days.

(21) Appl. No.: 09/250,526

(22) Filed: Feb. 16, 1999

(51) Int. Cl.$^7$ .................................................. H01L 21/31
(52) U.S. Cl. ..................... 438/745; 438/756; 438/757; 216/2; 216/11; 257/252; 257/417
(58) Field of Search .................. 438/48, 50, 51, 438/52, 703, 723, 756; 257/254, 417, 418

(56) References Cited

U.S. PATENT DOCUMENTS

| | | | |
|---|---|---|---|
| 4,907,064 | 3/1990 | Yamazaki | 357/54 |
| 5,130,576 | * 7/1992 | Adams et al. | 438/52 |
| 5,164,339 | * 11/1992 | Gimpelson | 438/52 |
| 5,293,781 | 3/1994 | Kaiser | 73/862.625 |

(List continued on next page.)

OTHER PUBLICATIONS

M.J. Rand and J.F. Roberts, "Silicon Oxynitride Films from the NO–NH$_3$–SiH$_4$ Reaction," *Journal of the Electrochemical Society: Solid–State Science and Technology*, vol. 120, pp. 446–453, Mar. 1973.

A.K. Gaind and E.W. Hearn, "Physiochemical Properties of Chemical Vapor–Deposited Silicon Oxynitride from a SiH$_4$–CO$_2$–NH$_3$–H$_2$ System," *Journal of Electrochemical Society: Solid–State Science and Technology*, vol. 125, pp. 139–145, Jan. 1978.

A.R. Shimkunas, "Advances in X–Ray Mask Technology," *Solid State Technology*, pp. 192–199, Sep. 1984.

T. Fuyuki, T. Saitoh, and H. Matsunami, "Low–Temperature Deposition of Hydrogen–Free Silicon Oxynitride without Stress by the Remote Plasma Technique," *Japanese Journal of Applied Physics*, vol. 29, pp. 2247–2250, Oct. 1990.

B.C.S. Chou, J.–S. Shie, and C.–N. Chen, "Fabrication of Low–Stress Dielectric Thin–Film for Microsensor Applications," *IEEE Electron Device Letters*, vol. 18, pp. 599–601, Dec. 1997.

*Primary Examiner*—Benjamin L. Utech
*Assistant Examiner*—Duy-Vu Deo
(74) *Attorney, Agent, or Firm*—John P. Hohimer

(57) ABSTRACT

The use of silicon oxynitride (SiO$_x$N$_y$) as a sacrificial material for forming a microelectromechanical (MEM) device is disclosed. Whereas conventional sacrificial materials such as silicon dioxide and silicate glasses are compressively strained, the composition of silicon oxynitride can be selected to be either tensile-strained or substantially-stress-free. Thus, silicon oxynitride can be used in combination with conventional sacrificial materials to limit an accumulation of compressive stress in a MEM device; or alternately the MEM device can be formed entirely with silicon oxynitride. Advantages to be gained from the use of silicon oxynitride as a sacrificial material for a MEM device include the formation of polysilicon members that are substantially free from residual stress, thereby improving the reliability of the MEM device; an ability to form the MEM device with a higher degree of complexity and more layers of structural polysilicon than would be possible using conventional compressively-strained sacrificial materials; and improved manufacturability resulting from the elimination of wafer distortion that can arise from an excess of accumulated stress in conventional sacrificial materials. The present invention is useful for forming many different types of MEM devices including accelerometers, sensors, motors, switches, coded locks, and flow-control devices, with or without integrated electronic circuitry.

62 Claims, 12 Drawing Sheets

U.S. PATENT DOCUMENTS

| | | | |
|---|---|---|---|
| 5,315,247 | 5/1994 | Kaiser | 324/244 |
| 5,332,697 | 7/1994 | Smith | 437/242 |
| 5,449,909 | 9/1995 | Kaiser | 250/336.1 |
| 5,631,782 | 5/1997 | Smith | 359/871 |
| 5,780,885 | 7/1998 | Diem | 257/254 |
| 5,798,283 | 8/1998 | Montague | 438/24 |
| 5,804,084 | 9/1998 | Nasby | 216/2 |
| 5,919,548 * | 7/1999 | Barron et al. | 438/138 |
| 5,922,212 * | 7/1999 | Kano et al. | 438/50 |
| 5,963,788 * | 10/1999 | Barron et al. | 438/48 |

* cited by examiner

USE OF SILICON OXYNITRIDE AS A SACRIFICIAL MATERIAL FOR MICROELECTROMECHANICAL DEVICES

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates to microelectromechanical (MEM) devices, also termed micromachines, and in particular to the use of silicon oxynitride as a sacrificial material for forming MEM devices. The present invention further relates to methods for improving the manufacturability and reliability of MEM devices based on the use of silicon oxynitride as a sacrificial material.

BACKGROUND OF THE INVENTION

Microelectromechanical (MEM) devices are microminiature devices formed on a substrate using fabrication process steps common to the integrated circuit (IC) fabrication industry. These MEM devices generally combine electrical and mechanical functionality to form devices such as accelerometers, sensors, motors, switches, coded locks, flow-control devices, etc. In some MEM devices, chemical functionality can also be provided to form chemical sensors.

The fabrication of MEM devices is generally based on the deposition and photolithographic patterning of alternate layers of polycrystalline silicon (also termed polysilicon) and a sacrificial material such as silicon dioxide ($SiO_2$) or a silicate glass (e.g. deposited from the decomposition of tetraethylortho silicate, also termed TEOS). Vias can be etched through the sacrificial material to provide anchor points to the substrate and between adjacent polysilicon layers. The polysilicon layers can be patterned and built up layer by layer to form various members of the MEM device structure. Once the MEM device structure is completed, the sacrificial material is partially or completely removed (e.g. by exposure to a selective etchant which does not attack the polysilicon layers) to release the polysilicon members of the MEM device for operation.

For proper functioning and reliability of the MEM device, it is desirable that the polysilicon members do not deform after release due to residual stress in the members. Such unwanted deformation can be a source of wear (e.g. between a moveable member and one or more adjacent fixed or moveable members), fatigue or cracking that can adversely affect the reliability of the MEM device.

In an attempt to reduce the residual stress a deposited polysilicon layer used to form particular members of a MEM device, an annealing step can be used after deposition of that layer. Similarly, an annealing step can be provided after fabrication of the MEM structure and before the etch release step. However, these annealing steps do not adequately reduce the stress in the polysilicon members, especially for MEM devices comprising several layers of structural polysilicon and having polysilicon members for which minimal stress is essential to proper functioning. The reason for this is that the sacrificial material itself is generally stressed to a substantial degree (e.g. a thin-film layer of silicon dioxide can have about 0.3–0.4 gigaPascals of residual compressive stress after deposition and annealing) and can impart stress to the polysilicon layer or members formed therefrom during repeated thermal cycling (i.e. during deposition and annealing steps).

The level of stress inherent in silicon dioxide or silicate glass sacrificial layers can also limit the number of structural polysilicon layers that can be used to build up a MEM device since an accumulation of compressive stress in multiple sacrificial layers can lead to wafer deformation (i.e. a distortion or bowing of the substrate). Such wafer deformation is problematic since it can result in fracture of the wafer, or in handling problems due to nonplanarity of the wafer. Additionally further photolithographic processing steps can be degraded as a result of the wafer deformation which presents a nonplanar surface of the wafer that can affect reticle image transfer and degrade feature resolution in the MEM device. Wafer deformation can also detrimentally affect the focusing capability of an autofocusing photolithographic stepper used to provide the reticle image transfer.

The practical effects of stress within conventional sacrificial materials used heretofore is thus to reduce the production yield of MEM devices, and to further to limit the number of structural polysilicon layers that can be used to form particular MEM devices. At present, MEM devices based on the use of conventional sacrificial materials are typically limited to only a few (three or four) structural layers of polysilicon, with each layer being about 1–2 $\mu$m thick. This limits the complexity and functionality of the MEM devices which can be built since more complicated devices require more structural layers of polysilicon from which to form interconnected moveable members such as linear or rotary motors, linkages, actuators, gear trains, moveable mirrors, etc. In our experience, the fabrication of a MEM device having four structural layers of polysilicon using a conventional sacrificial material can only be accomplished by deviating from a standard processing sequence used for the first three structural polysilicon layers due a substantial level of accumulated stress in the MEM structure which is not relieved by an annealing step.

What is needed is a way of removing the impediment presented by compressively-strained conventional sacrificial materials, including silicon dioxide and TEOS, to the fabrication of present and future MEM devices, thereby allowing the fabrication of MEM devices of increased complexity and having a greater number of structural polysilicon layers.

An advantage of the method of the present invention is that a residual stress buildup in a sacrificial material can be overcome to allow the fabrication of MEM devices having reduced stress in one or more polysilicon members thereof.

Another advantage of the present invention is that the silicon oxynitride sacrificial material can have a composition which is thermally stable so that little, if any, stress will be produced within the sacrificial material as a result of a large temperature change produced during a thermal annealing process step.

A further advantage of the present invention is that the use of silicon oxynitride can provide a sacrificial material for which the composition can be adjusted as needed to provide a predetermined level of stress in each sacrificial layer.

Still another advantage of the present invention is that silicon oxynitride can be used as a sacrificial material throughout a MEM device, or only in selected locations, thereby limiting the accumulation of stress which can otherwise lead to wafer deformation which is detrimental to the fabrication process.

Yet another advantage of the present invention is that the use of silicon oxynitride as a sacrificial material can reduce residual stress in one or more polysilicon members of a MEM device, thereby reducing structural deformation of the members upon release and substantially improving reliability of the MEM device.

These and other advantages of the method of the present invention will become evident to those skilled in the art.

SUMMARY OF THE INVENTION

The present invention relates to a method for forming a microelectromechanical (MEM) apparatus (also termed herein a MEM device) wherein one or more members, or deposited and patterned layers of polysilicon, are formed with a low value of residual stress, and preferably substantially stress-free. The present invention further relates to a method for improving the reliability of a MEM device by minimizing residual stress within a polysilicon member thereof. Finally, the present invention relates to a method for maintaining wafer planarity during formation of a plurality of MEM devices on a substrate, thereby improving manufacturability of the devices.

According to a preferred embodiment of the present invention, a method is disclosed for forming a MEM apparatus having at least one substantially stress-free moveable member that can be formed by depositing and patterning one or more layers of polysilicon on a substrate, encapsulating the member within a sacrificial material comprising silicon oxynitride, followed by annealing of the substrate for relieving (i.e. reducing) the stress, if any, within the member, and finally releasing the member for movement by removing part or all of the sacrificial material. The layer(s) of polysilicon used to form the member can be deposited above an upper surface of the substrate or within a cavity formed within the substrate using any conventional deposition method, including low-pressure chemical vapor deposition (LPCVD), rapid-thermal chemical vapor deposition (RTCVD), plasma-enhanced chemical vapor deposition (PECVD), or combinations thereof. The polysilicon moveable member can be patterned by photolithographic masking and etching, or by deposition into a mold formed in an underlying layer (i.e. a patterned layer of sacrificial material). When a molding process is used to form the moveable member, polysilicon that is deposited outside the mold can be removed by etching, or by a planarization step comprising chemical-mechanical polishing (CMP).

An essential part of the present invention is the use of silicon oxynitride as the sacrificial material and the selection of a composition for the silicon oxynitride that has a level of residual stress that is either less than that of silicon dioxide (i.e. <0.4 gigaPascals of compressive stress), or is oppositely strained from silicon dioxide. Although ideally the silicon oxynitride sacrificial material can be formed with zero stress therein, in practice for most types of MEM devices to be formed according to the present invention, a small level of stress can be accommodated (i.e. an absolute value of stress that is <0.25 gigaPascals); and this level of stress is small enough that the silicon oxynitride can be considered to be substantially-stress-free. When used in combination with compressively-strained conventional sacrificial materials, a composition for the silicon oxynitride can be selected that is tensile-strained (with preferably ≦0.5 gigaPascals of tensile stress) to offset an accumulation of compressive stress due to the conventional sacrificial materials.

A range of compositions useful for the silicon oxynitride sacrificial material of the present invention can be identified in terms of stress as described above, or alternately in terms of index of refraction which can be measured by ellipsometry. In terms of refractive index, the composition of the silicon oxynitride sacrificial layer should provide an index of refraction measured at a wavelength of 633 nanometers that is generally in the range of 1.5–1.7, and preferably in the range of 1.5–1.6.

After encapsulation of the polysilicon moveable member in one or more layers of silicon oxynitride, the substrate can be annealed at an elevated temperature for several hours (e.g. three hours at 1100° C.) to relieve the stress, if any, in the polysilicon. After the annealing step, electronic circuitry comprising a plurality of transistors can optionally be formed on the substrate and electrically connected to the moveable member for use in forming an intelligent MEM device. Then, the polysilicon member can be released for movement and operation by removing part or all of the silicon oxynitride sacrificial material (e.g. using a selective etchant comprising hydrofluoric acid).

The present invention can also be used to form a MEM device in which the silicon oxynitride sacrificial material is used to separate one or more pairs of deposited polysilicon layers which are used to form members of the MEM device. Here, the entire sacrificial material throughout the MEM device can comprise silicon oxynitride with a composition selected that is preferably substantially-stress-free. The term "substantially-stress-free" is defined herein to be a composition of silicon oxynitride that has an absolute value of stress that is less than or equal to 0.25 gigaPascals, or alternately a composition of silicon oxynitride that has an index of refraction at 633 nm that is in the range of 1.5–1.6. The structure of the MEM device according to this embodiment of the present invention can be built up by depositing and patterning alternating layers of polysilicon and substantially-stress-free silicon oxynitride.

In other embodiments of the present invention, a conventional sacrificial material (e.g. silicon dioxide) can be used to form one or more layers of a MEM device structure and substantially-stress-free or tensile-strained silicon oxynitride can be used to form other selected layers of the structure (e.g. to separate or surround one or more polysilicon layers wherein it is critical that the polysilicon members fabricated therefrom be formed with minimal stress). This selective use of silicon oxynitride as a sacrificial material is particularly useful when the MEM apparatus contains at least four layers of structural polysilicon. In this case, for example, silicon dioxide ($SiO_2$) can be used as the sacrificial material separating the first three layers of structural polysilicon, but becomes problematic due to an excessive accumulation of compressive stress in the $SiO_2$ when used below the fourth polysilicon structural layer. To overcome this problem, substantially-stress-free or tensile-strained silicon oxynitride can be used as the sacrificial material between the third and fourth layers of structural layers to minimize or limit any further accumulation of compressive stress within the MEM structure. The silicon oxynitride sacrificial material can also be used to separate any further layers of polysilicon (e.g. a fifth layer of polysilicon) that are used to build up the MEM structure.

The present invention further provides a method for improving the reliability of a MEM device by minimizing residual stress within a polysilicon member of the device which can otherwise lead to infant mortality or premature failure of the device. A key step to forming a MEM device with improved reliability is the use of substantially-stress-free silicon oxynitride in each sacrificial layer that contacts a polysilicon layer wherefrom a member is to be formed with minimal residual stress.

Finally, the present invention provides a method for maintaining wafer planarity during formation of a plurality of MEM devices on the wafer. According to this method, a plurality of polysilicon layers are deposited on the wafer for forming the microelectromechanical structure of each MEM device with at least one sacrificial layer comprising substantially-stress-free or tensile-strained silicon oxynitride used between adjacent of the polysilicon layers, thereby limiting or reducing a level of accumulated stress in the device structure to prevent wafer deformation which can otherwise limit manufacturability and reduce product yield.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

The method of the present invention can be applied to the formation of many different types of microelectromechanical (MEM) devices, including accelerometers, sensors, linear or rotary motors, gear trains, switches, actuators, relays, microfluidic devices, etc. formed from a plurality of layers of deposited and patterned polysilicon (i.e. polycrystalline silicon). In general, the complexity and functionality of the MEM devices that can be formed utilizing the present invention will scale super-linearly with the number of layers of polysilicon that are provided for fabricating moveable members and other elements of the MEM device. To illustrate the principles and use of the present invention, the invention will be described by way of example in terms of the fabrication of a multi-layer MEM device 10 containing a plurality of interconnected gears 100 mounted on hubs 102 to form a gear train as shown in schematic cross-section view in FIG. 1.

Figure 1:
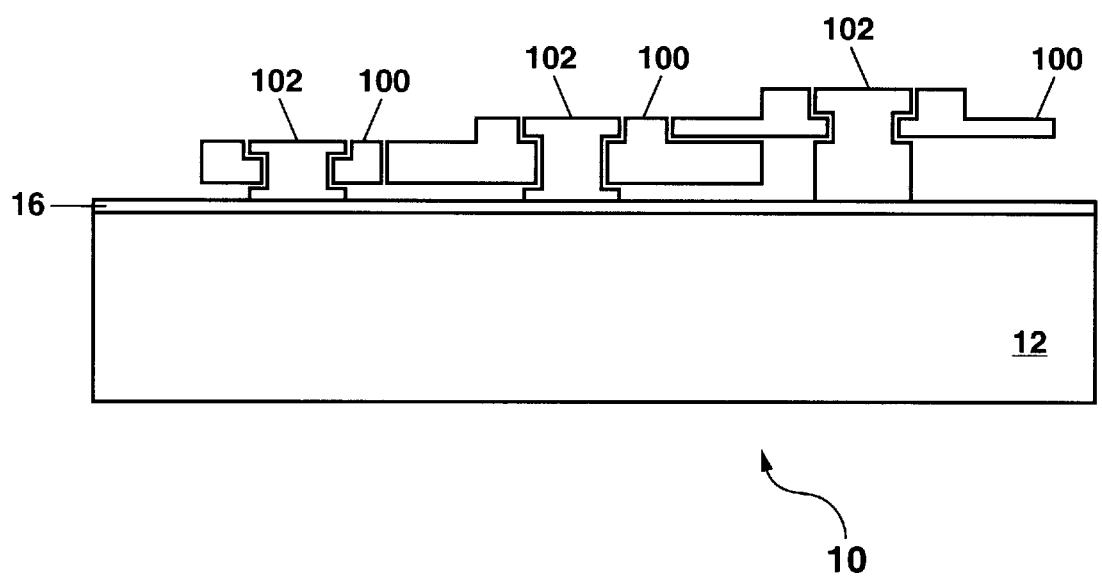
FIG. 1 schematically illustrates a cross-sectional representation of a representative MEM device formed according to the present invention.

The MEM device 10 in the example of FIG. 1 is built up of five layers of structural polysilicon on a substrate 12 (preferably silicon) using many individual reticles for defining the various mechanical members (e.g. gears and hubs and other elements not shown in FIG. 1 such as electrostatic motors, linkages, levers, actuators, guides, stops etc.) of the device. Fabrication of such a MEM device 10 can require up to hundreds of individual process steps. Only the handful of process steps that are relevant to the present invention will be described herein in detail. Those skilled in the art will understand the use of other conventional integrated circuit (IC) or micromachining process steps which will not be described in detail herein. Such conventional process steps include, for example, formation of a mask (e.g. a photoresist mask, or a hard mask comprising about 500 nanometers of patterned TEOS patterned by etching using an overlying photoresist mask which is then removed) overlying a polysilicon or sacrificial material layer in preparation for defining features into the layer by etching. Such conventional process steps further include etching (e.g. reactive ion etching) for removing material from the masked layer at locations corresponding to openings in the mask; stripping of the mask after the etching is complete; and various cleaning processes.

In FIG. 1, the substrate 12 is preferably a monocrystalline silicon wafer, or a portion thereof. The term "substrate" as used herein is defined to include both a monocrystalline silicon wafer, and a monocrystalline silicon wafer having one or more monocrystalline layers of silicon epitaxially grown thereon or bonded thereto (e.g. one or more doped or undoped epitaxial silicon layers having a total layer thickness generally in the range of 2–10 $\mu$m for providing a smooth low-defect-density upper surface 14 that can be used for the formation of electronic circuitry on the substrate). The term "substrate" is further intended to include a silicon-on-insulator (SOI) substrate. The substrate 12 can be either undoped or doped (e.g. n-type or p-type doped) depending on particular requirements for the MEM device 10, including whether or not electronic circuitry is to be fabricated on the substrate for actuation or sensing of the MEM device 10.

The substrate 12 can be initially prepared by forming a blanketing layer of up to a few hundred nanometers of a thermal oxide (not shown in FIG. 1) using a conventional wet oxidation process (e.g. by exposing the substrate to a wet ambient at 1050° C. for 1.5 hours). A layer of low-stress silicon nitride (also not shown in FIG. 1) can then be deposited over the thermal oxide layer when the MEM device 10 is to be electrically isolated from the substrate 12 This optional layer of silicon nitride can be deposited, for example, by low-pressure chemical vapor deposition (LPCVD) at about 850° C. to a layer thickness of, for example, 500–800 nanometers.

Figure 2A:
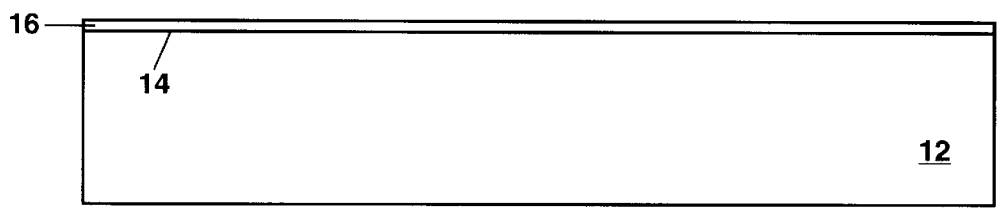
FIGS. 2a–2i schematically illustrate the formation of the MEM device in FIG. 1.

In FIG. 2a, a first layer of polysilicon 16 with a layer thickness of, for example, 300 nanometers is deposited to blanket the substrate 12. This first polysilicon layer 16 is typically denoted as the "Poly-0" layer since it is not used to form the structure of the MEM device 10, but instead is used to form a voltage reference plane (e.g. a ground plane) for the device 10, or electrical connections between elements of the device 10. If the Poly-0 layer 16 is to be electrically connected to the substrate 12, this can be done by forming one or more vias through any underlying layers (e.g. the electrically-insulating thermal oxide and silicon nitride layers) prior to deposition of the Poly-0 layer 16. To make the Poly-0 layer 16 and other structural layers of polysilicon electrically conductive as needed, a dopant such as phosphorous or boron can be added to the polysilicon layers during deposition, or afterward by thermal dopant diffusion or ion implantation.

All polysilicon layer depositions described herein can be performed, for example, by LPCVD at a temperature of about 580° C. Alternately, one or more of the polysilicon layers can be deposited using rapid thermal chemical vapor deposition (RTCVD) wherein the substrate 12 is rapidly heated to a temperature of about 650–680° C. in an ambient of silane (SiH$_4$) to deposit the polysilicon at a rate on the order of 0.1–0.15 µm per minute. Other conventional polysilicon deposition methods, including plasma-enhanced chemical vapor deposition (PECVD) and atmospheric-pressure chemical vapor deposition, are also applicable to the present invention.

To form the MEM device 10 in the example of FIG. 1, five structural layers of polysilicon are deposited over the substrate 12 above the Poly-0 layer 16, with the structural polysilicon layers typically having layer thicknesses in the range of about 0.5–2 µm or more, and with elements of the MEM device 10 formed from the polysilicon structural layers typically having in-plane lateral dimensions ranging from about 1 µm or less up to several hundred microns.

Figure 2B:
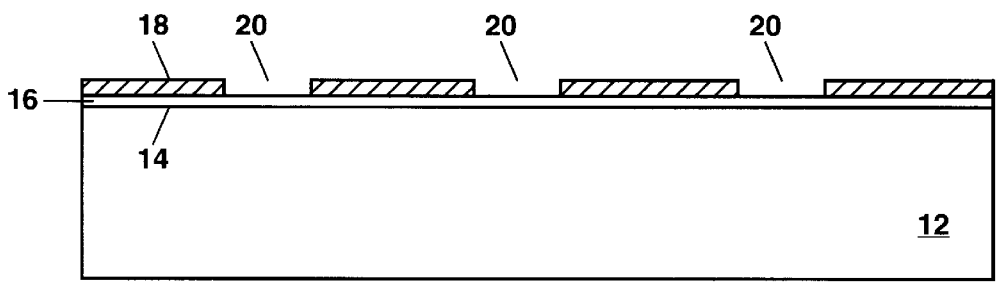

In FIG. 2b, a first sacrificial layer 18 is blanket deposited over the substrate and patterned by etching to form a plurality of shaped openings 20 to form a mold wherein a first structural polysilicon layer 22 can be deposited for use in forming particular moveable members or other elements of the MEM device 10. The term "patterned" as used herein means a series of process steps including applying a photoresist to a surface of a material layer (e.g. the layer 18), pre-baking the photoresist, aligning the layer covered with photoresist with a photomask (also termed a reticle), exposing and developing the photoresist to remove the photoresist at locations where particular features are to be formed, etching downward into or through a portion of the layer not protected by the photoresist, and removing the remaining photoresist so that further processing can take place.

According to the present invention, at least one of the sacrificial layers used for forming the MEM device 10 comprises silicon oxynitride (SiO$_x$N$_y$) that is either substantially-stress-free or tensile strained. The number of layers comprising silicon oxynitride will be selected by an analysis of the total number of sacrificial layers needed for forming the MEM device 10, the thickness of each sacrificial layer, and a level of accumulated stress in the sacrificial layers which can be tolerated without resulting in wafer deformation or substantial stress in one or more polysilicon members of the MEM device 10.

In our experience, it has been possible to form a MEM device with up to three sacrificial layers comprising conventional materials such as silicon dioxide or TEOS and three structural layers of polysilicon without substantial wafer deformation due to accumulated stress in the sacrificial layers. However, with more than three layers of these conventional sacrificial materials, the accumulated stress produced by a fourth sacrificial layer can lead to wafer deformation after a thermal annealing step. This wafer deformation can prevent the subsequent photolithographic definition of features in an overlying fourth structural polysilicon layer, and can be problematic for loading the wafer into etching or annealing equipment. Thus, while according to the present invention, it is preferable to form all the sacrificial layers in a MEM device 10 from substantially-stress-free silicon oxynitride to limit an accumulation of stress in the sacrificial layers, it is only necessary that substantially-stress-free or tensile-strained silicon oxynitride be used as the sacrificial material separating or encapsulating any polysilicon layers formed above the third polysilicon layer when a conventional compressively-strained sacrificial material is used exclusively below the third polysilicon layer.

Thus, in the example of FIGS. 1 and 2a–2i, the first sacrificial layer 18 can comprise either a conventional sacrificial material such as silicon dioxide or TEOS (deposited from the decomposition of tetraethylortho silicate by LPCVD at about 750° C. and densified by high temperature processing), or alternately silicon oxynitride. When the first sacrificial layer 18 comprises silicon oxynitride, the silicon oxynitride composition can be selected to provide a predetermined level of residual stress that has an absolute value of less than 0.5 gigaPascals (GPa) and preferably less than 0.25 GPa. In terms of refractive index, the composition of the silicon oxynitride can be selected to provide an index of refraction measured (e.g. by ellipsometry) at a wavelength of 633 nanometers that is generally in the range of 1.5–1.7, and preferably in the range of 1.5–1.6.

An advantage of silicon oxynitride as a sacrificial material according to the present invention is that the silicon oxynitride composition can be adjusted to tailor the residual stress therein. This allows the formation of a silicon oxynitride sacrificial layer that is either substantially-stress-free or else oppositely strained from conventional compressively-strained sacrificial materials such as silicon dioxide and TEOS. Thus, one or more tensile-strained silicon oxynitride sacrificial layers can be used to offset the accumulated stress produced by one or more conventional compressively-strained sacrificial layers, thereby allowing the MEM device 10 to be fabricated with more structural polysilicon layers than would otherwise be possible.

A silicon oxynitride first sacrificial layer 18 can be formed, for example, by LPCVD at a temperature in the range of 750–950° C. and preferably about 850–900° C. and a total pressure of about 200 milliTorr, using dichlorosilane (SiCl$_2$H$_2$), nitrous oxide (N$_2$O) and ammonia (NH$_3$) as source gases. The flow of SiCl$_2$H$_2$ can be about 60 standard cubic centimeters per minute (sccm), with a combined flow of the N$_2$O and NH$_3$ being about 180 sccm. The composition of the deposited silicon oxynitride sacrificial layer can be easily varied by adjusting the flow ratio of the N$_2$O to the combination of the combined flow of N$_2$O and NH$_3$ $$\left(\text{i.e. } \frac{N_2O}{N_2O + NH_3}\right).$$

Table 1 shows various compositions of silicon oxynitride that can be deposited at 850° C. by the above LPCVD method according to the present invention. In Table 1, it can be seen that the residual stress in an as-deposited layer of the silicon oxynitride can be varied from a tensile stress of nearly 1 GPa to a compressive stress of −0.16 GPa by controlling the flow ratio during deposition In Table 1, the substantially-stress-free

TABLE 1

Figure 3:
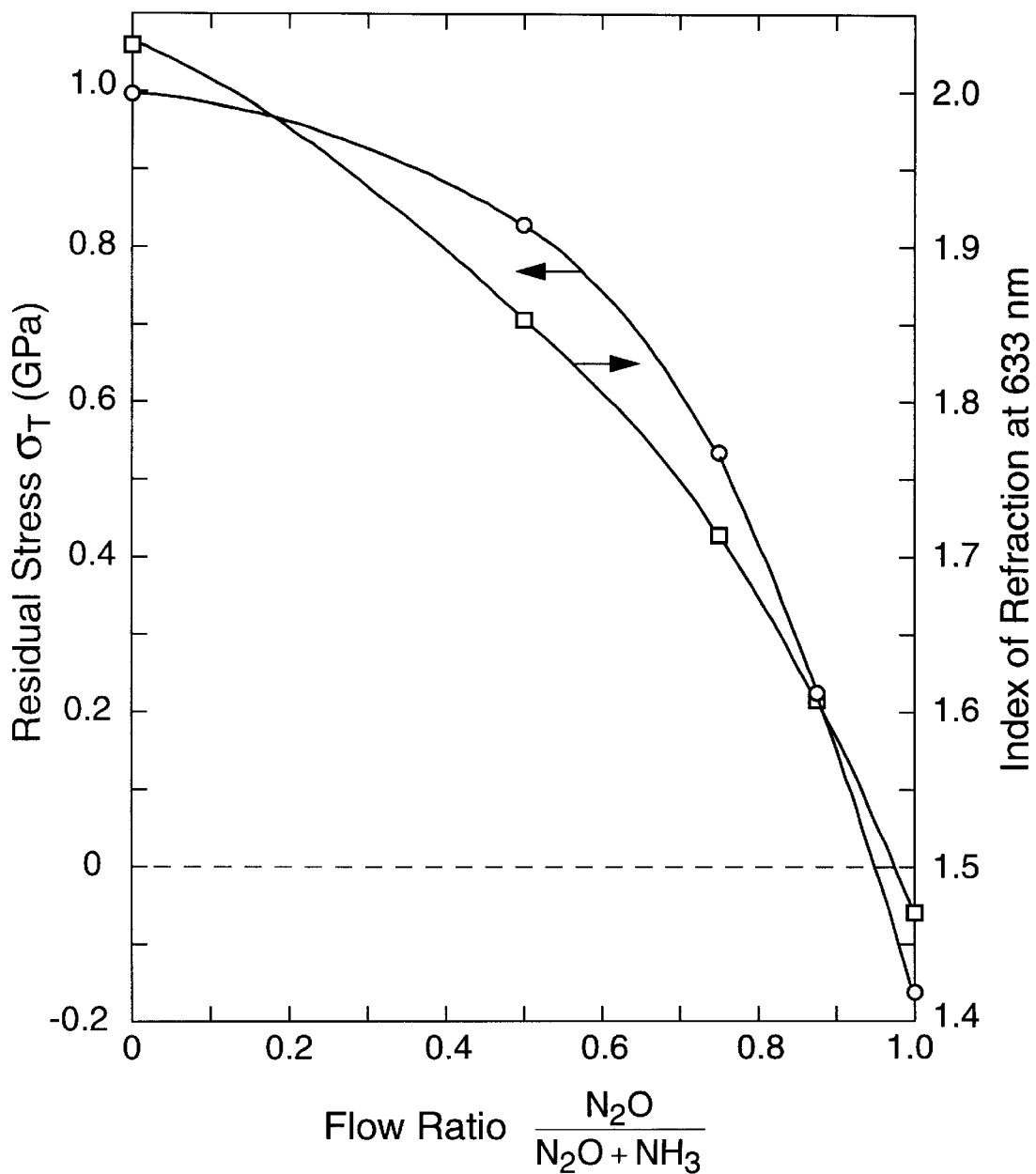
FIG. 3 shows the residual stress and index of refraction of various compositions of silicon oxynitride obtained according to the present invention by varying the flow ratio of $N_2O$ to the combined flow of $N_2O$ and $NH_3$ during deposition of the silicon oxynitride by low-pressure chemical vapor deposition using dichlorosilane ($SiCl_2H_2$) as an additional source gas.

| Flow Ratio $\frac{N_2O}{N_2O + NH_3}$ | Deposition Rate (nm/min.) | Residual Stress $\sigma_T$ As Deposited (GPa) | $\sigma_T$ After 900° C. Anneal for 3 Hours (GPa) | $\sigma_T$ After 1100° C. Anneal for 3 Hours (GPa) | Index of Refraction at 633 nm |
|---|---|---|---|---|---|
| 0.00 | 6.94 | 0.992 | 1.071 | 0.984 | 2.030 |
| 0.50 | 3.01 | 0.826 | 0.926 | 1.076 | 1.853 |
| 0.75 | 1.15 | 0.534 | 0.608 | 0.615 | 1.714 |
| 0.875 | 0.50 | 0.225 | 0.228 | 0.220 | 1.608 |
| 1.00 | 0.11 | −0.161 | −0.607 | — | 1.470 | free composition of silicon oxynitride produced at a flow ratio of 0.875 is particular significant since the residual stress is substantially unchanged after annealing for three hours at a temperature in the range of 900–1100° C. The data in Table 1 is further shown in graphic form in FIG. 3 to show the variation in residual stress, $\sigma_T$, and index of refraction at 633 nanometers that can be obtained by controlling the flow ratio of $N_2O$ to the combined flow of $N_2O$ and $NH_3$.

The exact composition of silicon oxynitride to be preferred according to the present invention will, in general, depend upon the type of MEM device 10 to be fabricated, including the total number and thickness of the sacrificial layers, and whether any of the sacrificial layers are to be formed from conventional sacrificial materials (e.g. silicon dioxide or TEOS). As an example, the fabrication of a MEM device 10 with five structural polysilicon layers as shown in FIGS. 2a–2i requires the use of a total of six sacrificial layers. If one or more of these sacrificial layers comprise-compressively strained silicon dioxide or TEOS, the remaining sacrificial layers can be either formed of tensile-strained silicon oxynitride to counter the accumulation of compressive stress in the first three sacrificial layers, or of substantially-stress-free to minimize any further accumulation of compressive stress in the aggregate sacrificial material.

In some instances, it can be preferable to form the entire MEM device 10 in FIGS. 2a–2i using silicon oxynitride as the sacrificial material. This can be done using either a single composition of silicon oxynitride that is tensile-strained (e.g. less than 0.5 GPa stress) or substantially-stress-free. Alternately, alternating layers of silicon oxynitride can be deposited with two different compositions having different residual stress characteristics (e.g. by alternating layers of compressively-strained silicon oxynitride and tensile-strained silicon oxynitride to balance the accumulated stress in the sacrificial material). In other instances, it can be preferable to provide substantially-stress-free silicon oxynitride sacrificial layers to surround or encapsulate only a particular polysilicon member (e.g. a moveable member) that must be formed with minimal stress after an annealing step, while the composition of other of the sacrificial layers in the MEM device 10 is less critical so that less attention need be given to control the exact composition and stress characteristics in these other sacrificial layers.

Returning to FIG. 2c, a layer of polysilicon is deposited to blanket the substrate 12 and the patterned first sacrificial layer 18 to form a first structural polysilicon layer 22 (also termed herein as a "Poly-1" layer), preferably with a layer thickness sufficient to overfill the shaped openings 20. A portion of the layer 22 outside the shaped openings 20 can be removed down to or slightly below the underlying first sacrificial layer 18 either by masking to cover the shaped openings and then etching the unmasked area of the substrate 12, or by using chemical-mechanical polishing (CMP) to globally planarize the substrate 12.

Figure 2C:
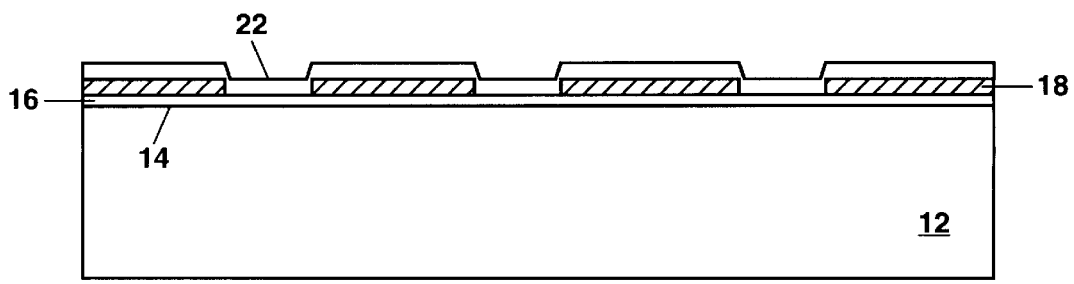

Chemical-mechanical polishing utilizes a rotating polishing pad and slurry (e.g. an alkaline colloidal-fumed silica slurry) under controlled conditions of rotation speed, applied pressure and temperature to planarize the substrate 12 or material layers deposited thereon by removing material down to a predetermined level. The CMP step can proceed until an uppermost deposited layer (e.g. layer 22) is removed down to or slightly below the top surface of an underlying layer (e.g. layer 18), thereby globally planarizing the substrate 12. The CMP step can also be used to precisely adjust the thickness of the first sacrificial layer 18 and the Poly-1 layer 22 (i.e. the remainder of the polysilicon layer deposited within the shaped openings 20). Advantages of the CMP step are that it eliminates stringers which can be otherwise formed by dry etching (e.g. reactive ion etching); it can be used to planarize each successive structural polysilicon layer, thereby preventing mechanical interferences between different members each formed in an adjacent structural polysilicon layer; and it prevents a degradation of the surface topography which can occur when one layer is deposited over another patterned layer as shown in FIG. 2c. Further details of chemical-mechanical polishing as applied to surface micromachining can be found in U.S. Pat. No. 5,804,084 which is incorporated herein by reference.

Figure 2D:
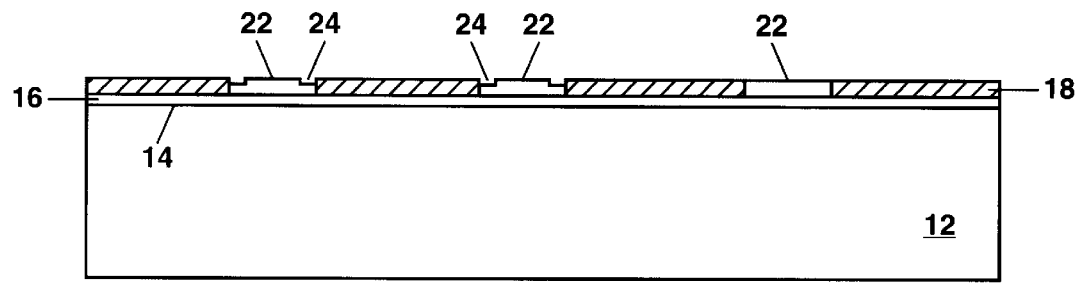

After the substrate 12 has been globally planarized, a patterning step can be used as needed to etch features 24 into the Poly-1 layer 22 as shown in FIG. 2d. This patterning step can be used to provide for the subsequent formation of fillets 30 of sacrificial material to separate adjacent polysilicon members (e.g. to provide a predetermined spacing between a hub and a gear being formed from polysilicon to allow the gear to rotate about the hub when the fillet 30 of sacrificial material is later etched away).

Figure 2E:
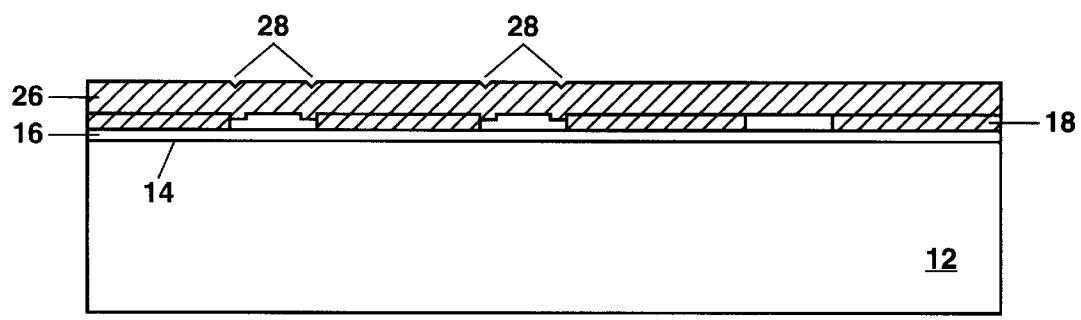

In FIG. 2e, the etched features 24 are filled in by blanket deposition of a second sacrificial layer 26 over the substrate 12 in a manner similar to that previously described for the first sacrificial layer 18. The second sacrificial layer 26 can comprise either a conventional sacrificial material such as silicon dioxide or TEOS; or alternately the second sacrificial layer 26 can comprise silicon oxynitride with a composition that is the same or different from that of the first sacrificial layer 18.

After encapsulating the Poly-1 layer with sacrificial material, an optional annealing step (e.g. at 1100° C. for 3 hours) can be performed to anneal out any stress that may exist in the Poly-1 layer due to deposition. The second sacrificial layer 26 can then be planarized by a CMP step to remove any dimples 28 caused by deposition of the second sacrificial layer 26 over the features 24. Additionally, planarizing of the second sacrificial layer 26 can be used for precisely determining the thickness of this layer.

Figure 2F:
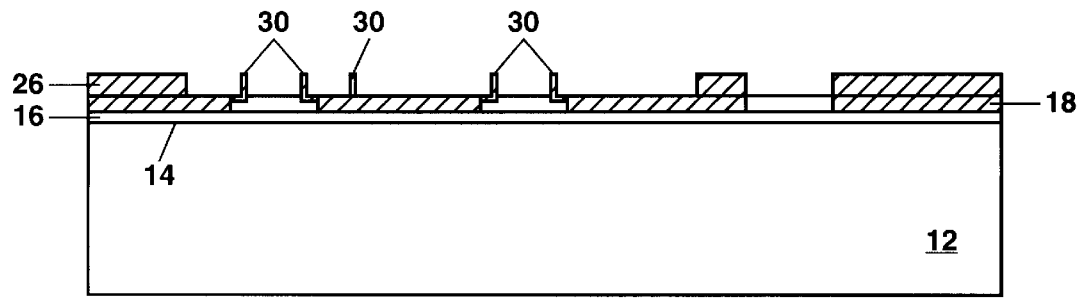
Figure 2G:
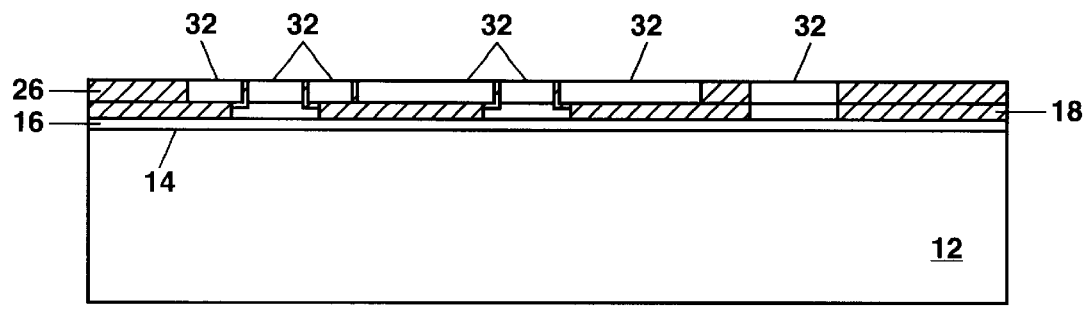

The second sacrificial layer 26 can then be patterned as shown in FIG. 2f by masking the layer 26 and etching (e.g. reactive ion etching) the layer to form a mold for defining features in a second structural polysilicon layer (termed herein as "Poly-2") to be subsequently deposited over the patterned layer 26 and into the mold. This patterning step can be used to form fillets 30 of sacrificial material where needed to separate closely-spaced polysilicon members being formed for the structure of the MEM device 10. In FIG. 2g, the Poly-2 layer 32 has been blanket deposited to overfill the molds formed in the second sacrificial layer 26 and then planarized down to the second sacrificial layer 26 by a CMP or etching step.

Figure 2H:
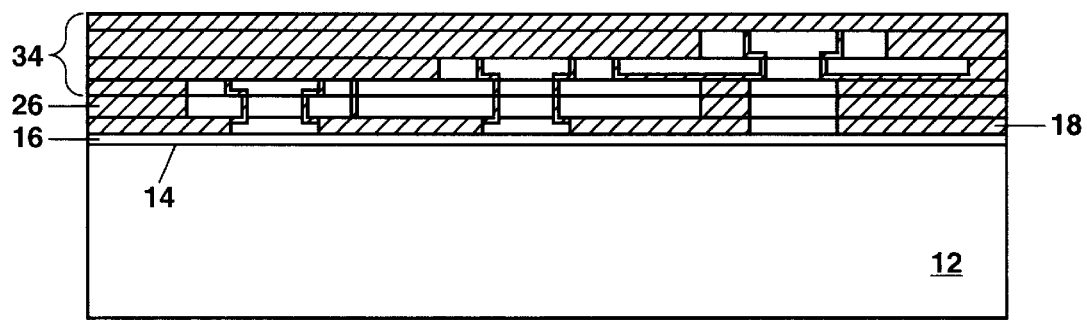

In FIG. 2h, the structure of the MEM device 10 is built up by repeating the sequence of depositing and patterning additional layers 34 of sacrificial material and polysilicon of predetermined layer thicknesses to form polysilicon members in a third polysilicon layer 36 (denoted Poly-3), a fourth polysilicon layer 38 (denoted Poly-4), and a fifth polysilicon layer 40 (denoted Poly-5). Each successive layer of polysilicon can be optionally annealed (e.g. for three hours at 1100° C.) to relieve any stress present in the polysilicon layer as a result of deposition. A final annealing step (e.g. three hours at 1100° C.) can also be performed after a final sacrificial layer is blanket deposited to encapsulate the structure of the MEM device 10 as shown in FIG. 2h.

Although this example of the present invention has been described in terms of forming one or more molds in each sacrificial layer for the patterning of a subsequently deposited polysilicon layer, those skilled in the art will understand that the MEM device 10 of FIG. 1 can also be formed by depositing and patterning each successive structural polysilicon layer to form a plurality of shaped openings therein (i.e. a mold) so that an overlying sacrificial layer can be deposited to fill in the openings. In this alternate fabrication method, each sacrificial layer in turn can be planarized down to the underlying structural polysilicon layer to build up the same device structure shown in FIG. 2h. With either fabrication method, it is preferable that no more than three of the sacrificial layers comprise a conventional sacrificial material such as $SiO_2$ or TEOS, with any further sacrificial layers comprising silicon oxynitride of a predetermined composition that is either substantially-stress-free or tensile-strained.

Figure 2I:
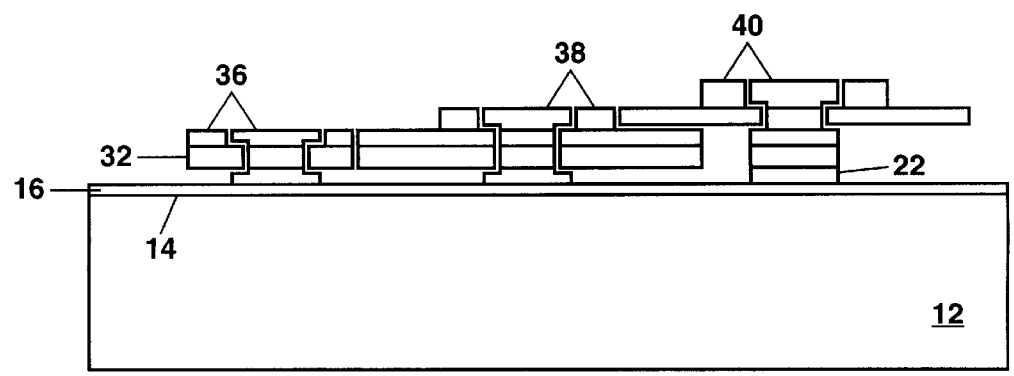

In FIG. 2i, the polysilicon members can be released for operation by etching away the sacrificial material using a selective wet etchant comprising hydrofluoric acid (HF). The composition of the selective wet etchant is selected to dissolve the sacrificial material while not substantially attacking the polysilicon layers used for forming the MEM device 10. In order to remove all of the sacrificial material including the fillets 30, the wet etching process can proceed for a long time duration (several hours or longer). A plurality of generally micron-sized access holes (not shown) can be formed through the members formed in each structural polysilicon layer to allow the selective wet etchant to reach any underlying sacrificial material. In some instances, pockets of sacrificial material can be completely surrounded by polysilicon. Access holes through the polysilicon can be used to etch out the sacrificial material, or the sacrificial material can be left in place by not providing access holes in the surrounding polysilicon, especially if the sacrificial material is substantially-stress-free and is designed to become a part of a particular member of the MEM device 10 (e.g. to reinforce and strengthen that member).

After the etch removal step, the substrate 12 can be washed and dried; and the completed MEM device 10 can be packaged for use. Hundreds to thousands of MEM devices 10 can be batch-fabricated on a single semiconductor wafer, fully assembled without any need for piece-part assembly.

Figure 4:
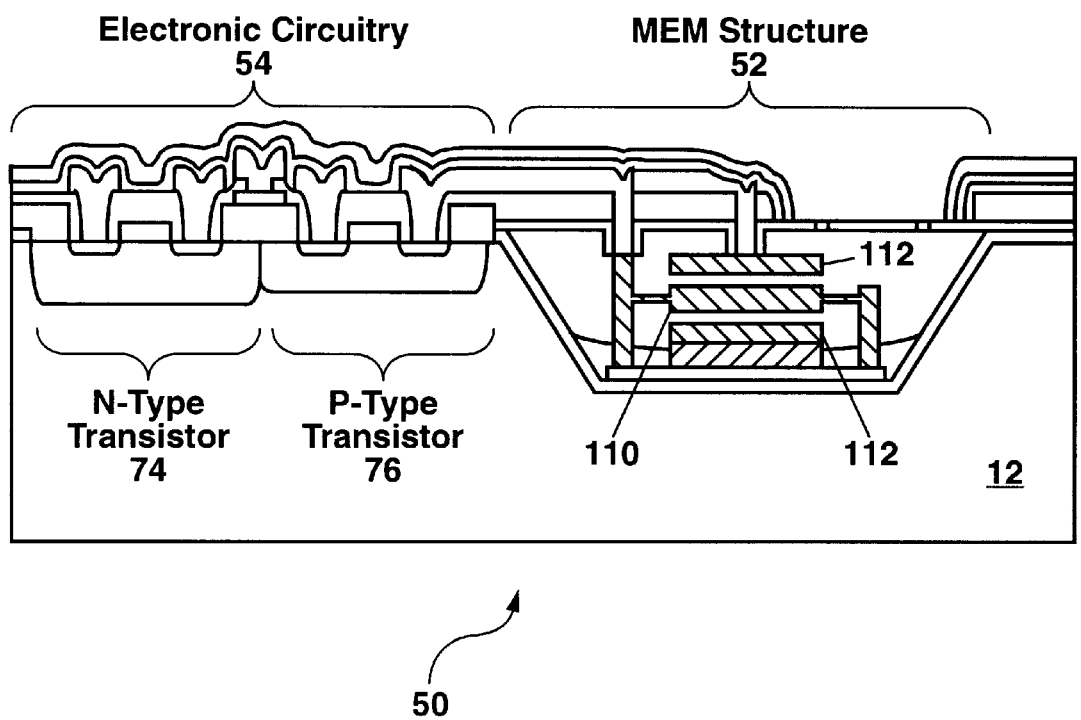
FIG. 4 schematically illustrates a cross-sectional representation of a representative integrated MEM device formed according to the present invention.

FIG. 4 shows a representative example of an integrated MEM device 50 in the form of an accelerometer fabricated according to the present invention. This integrated MEM device 50 comprises a microelectromechanical structure 52 integrated with electronic circuitry 54. The integrated MEM device 50 in FIG. 4 utilizes silicon oxynitride as a sacrificial material for one or more of the sacrificial layers used to fabricate the integrated device 50.

Figure 5A:
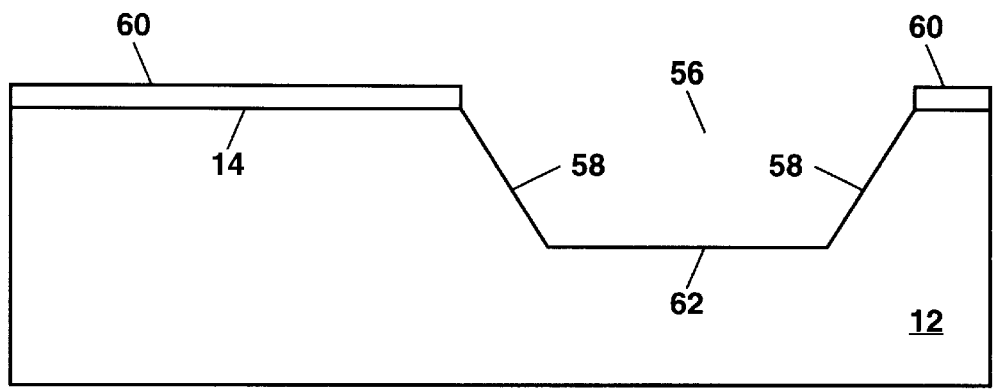
FIGS. 5a–5q schematically illustrate the formation of the integrated MEM device in FIG. 4.
Figure 5B:
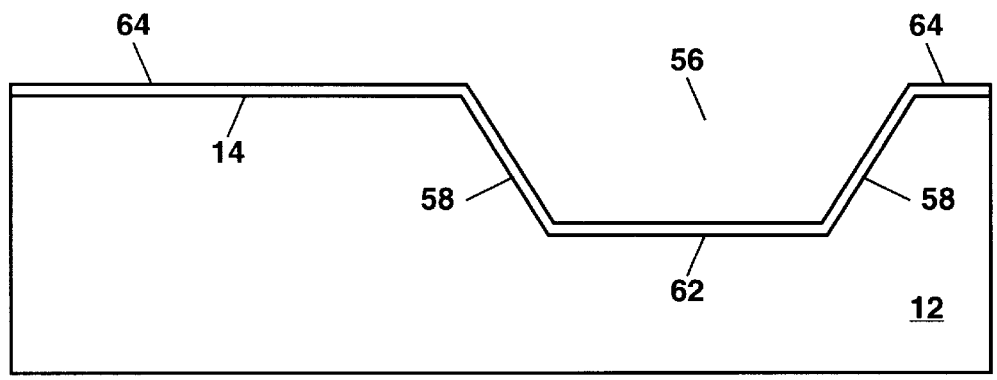
Figure 5C:
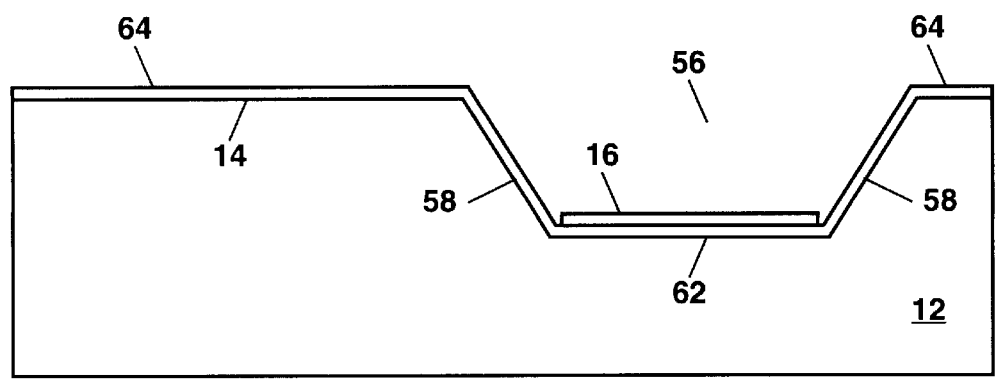
Figure 5D:
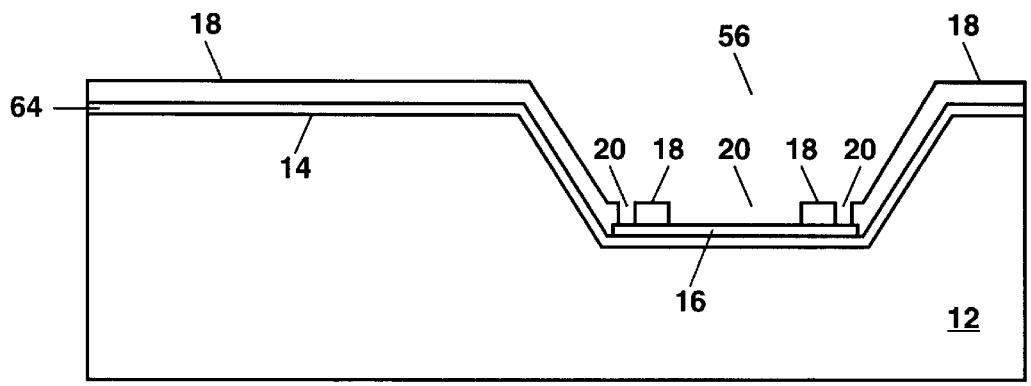
Figure 5E:
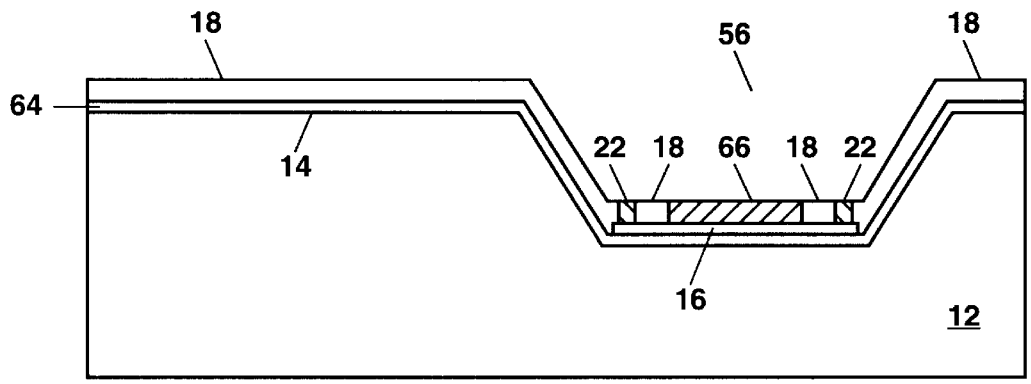
Figure 5F:
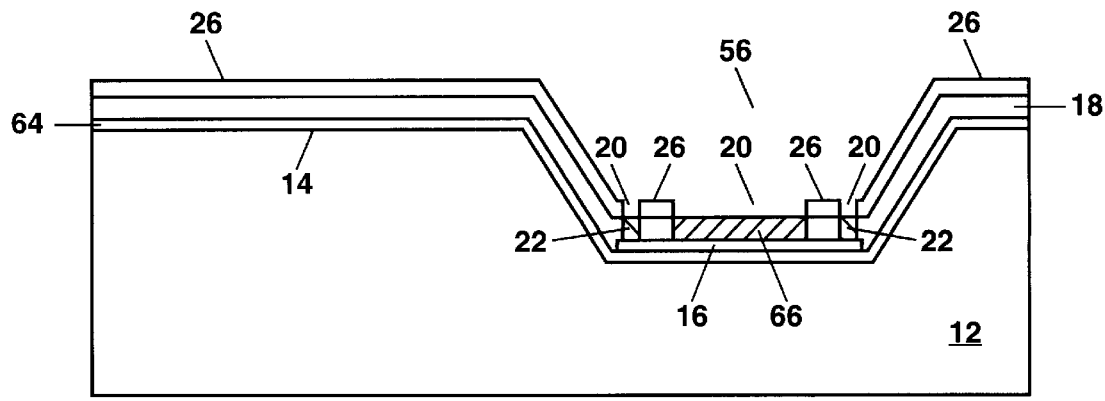
Figure 5G:
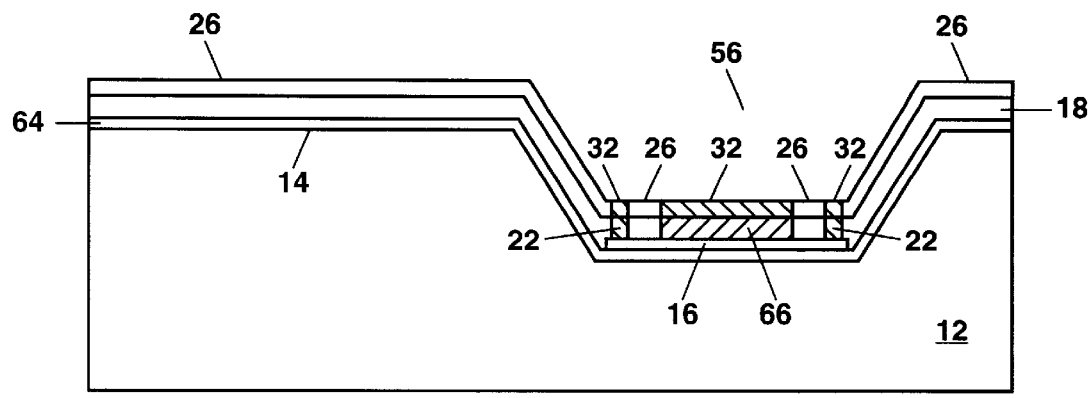
Figure 5H:
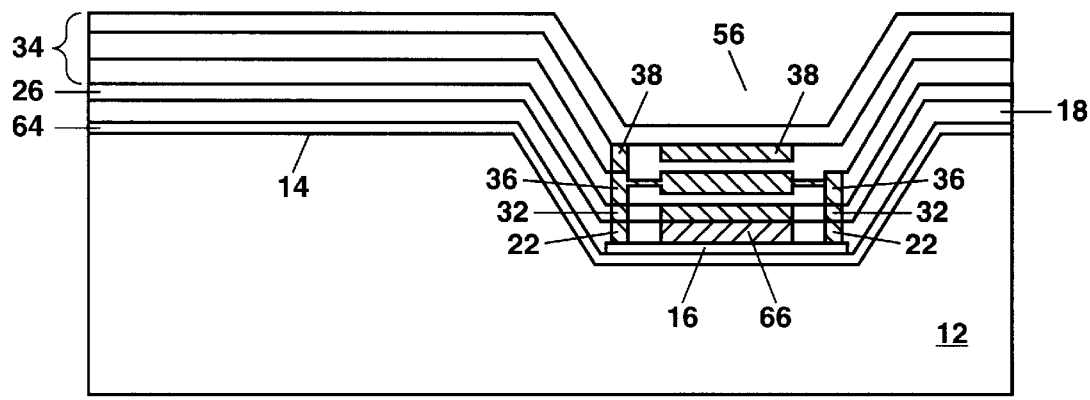
Figure 5I:
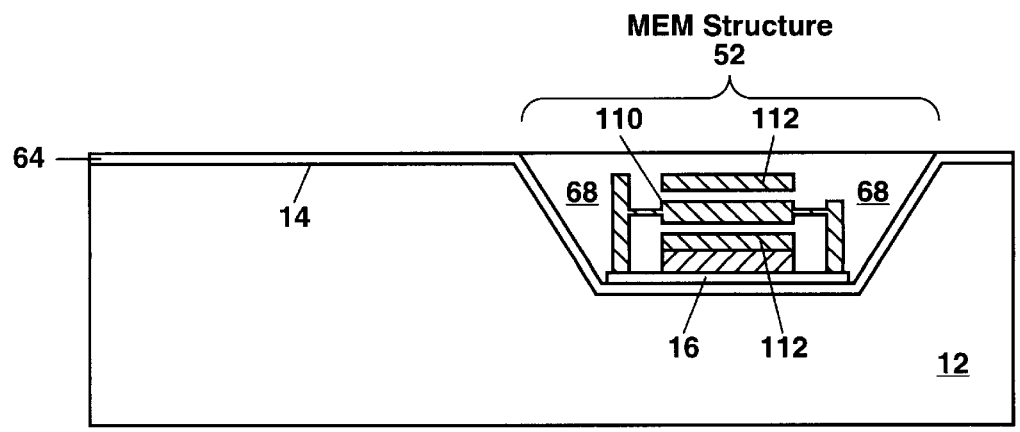
Figure 5J:
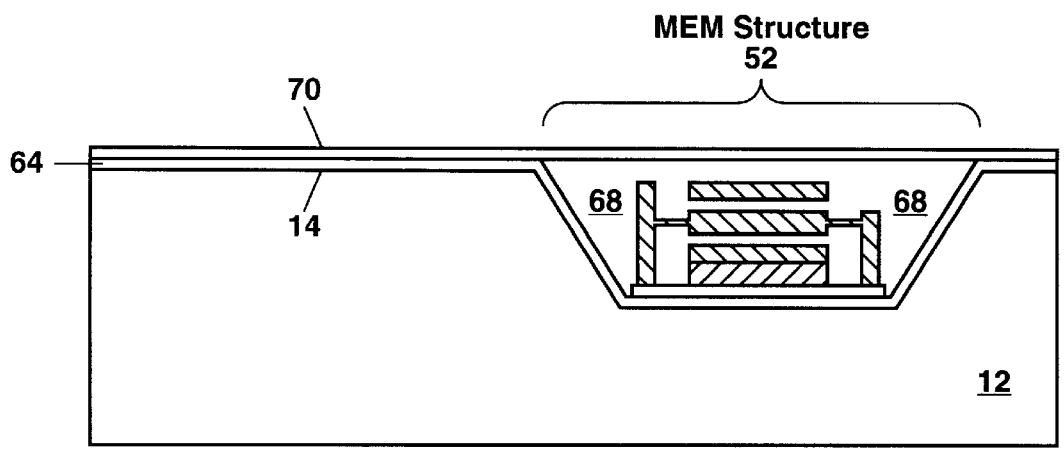
Figure 5K:
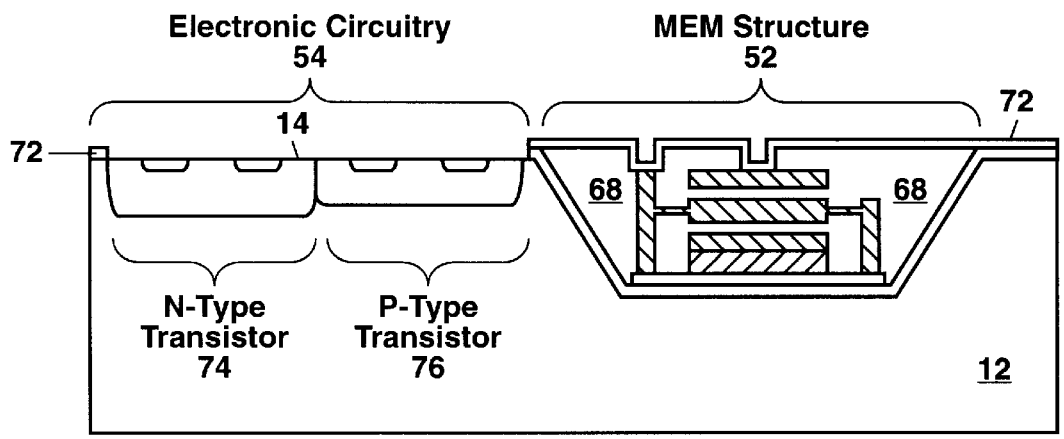
Figure 5L:
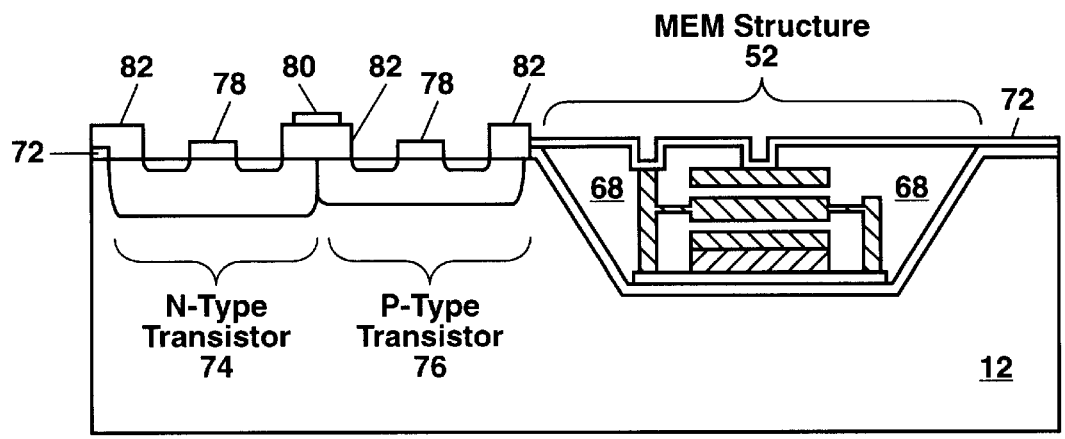
Figure 5M:
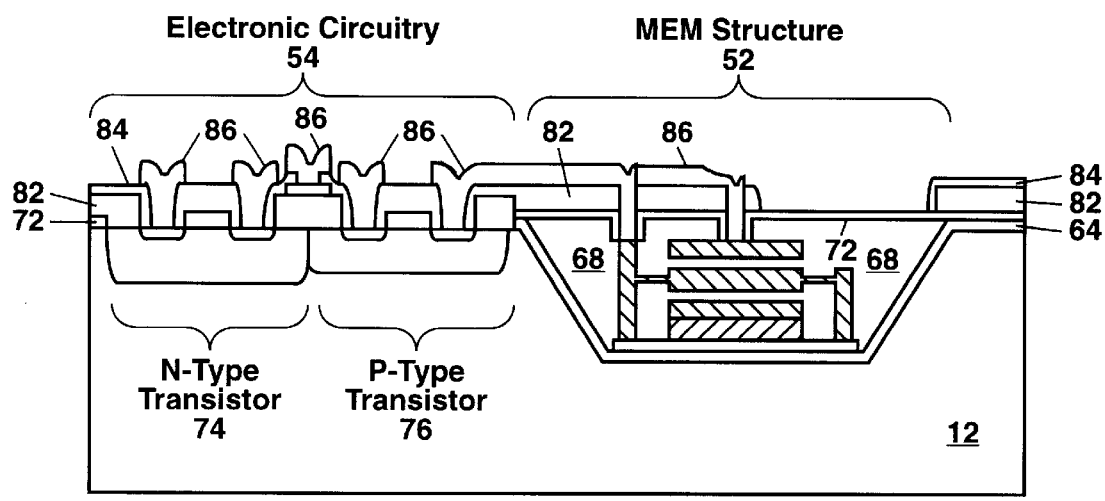
Figure 5N:
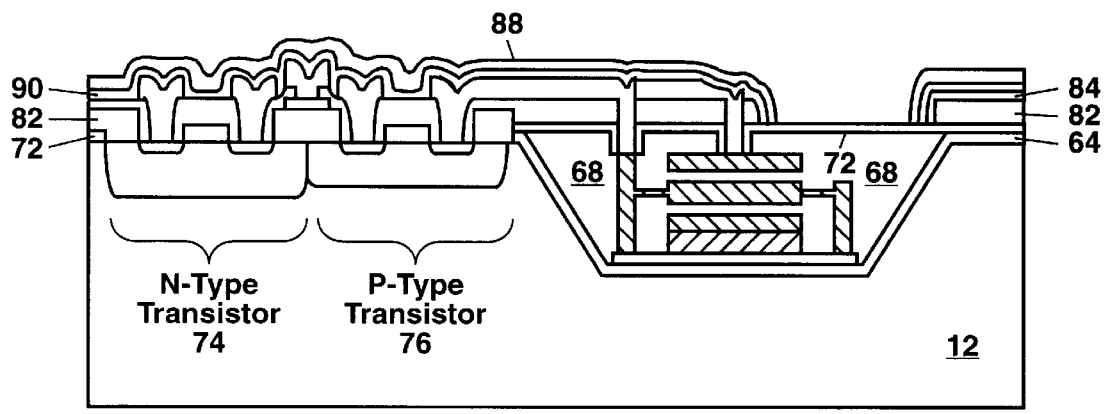
Figure 5O:
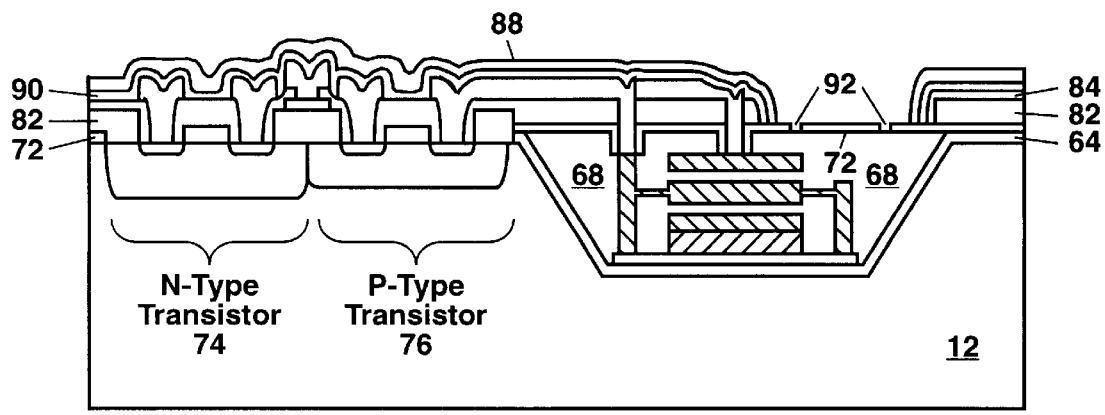
Figure 5P:
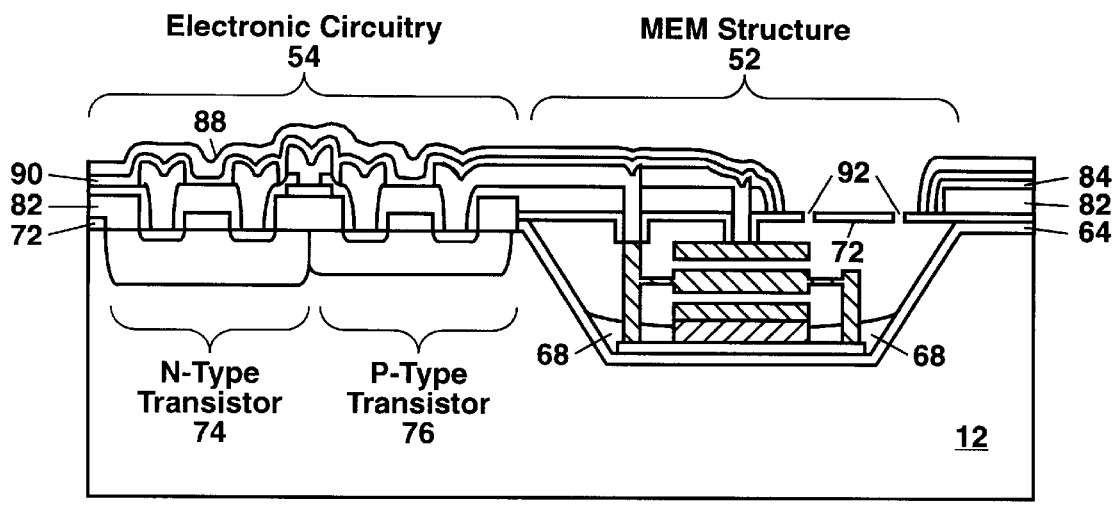
Figure 5Q:
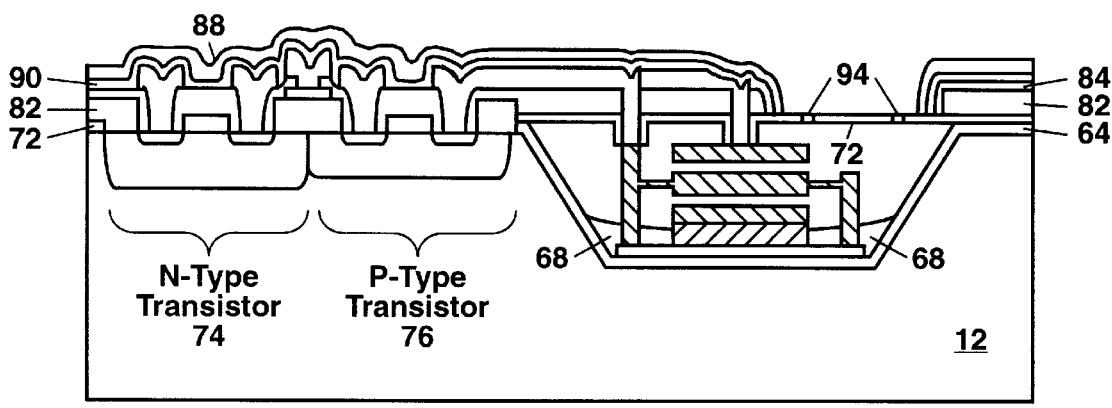

FIGS. 5a–5q schematically illustrate the formation of the integrated MEM device 50 according to the present invention. The substrate 12 used for forming the integrated MEM device 50 can be either n-type doped, or p-type doped, or undoped (i.e. not intentionally doped) depending upon the type of electronic circuitry 54 to be formed on the substrate 12 For example, an n-type substrate 12 can be used to form electronic circuitry 54 by one set of standard complementary-metal-oxide-semiconductor (CMOS) process steps having 2-$\mu$m design rules; whereas for electronic circuitry 54 formed by another set of standard CMOS processing steps having 0.5-$\mu$m design rules, a p-type substrate 12 can be preferred. Alternately, the electronic circuitry 54 can be formed on a silicon layer (e.g. 2–10 $\mu$m of doped or undoped monocrystalline silicon) epitaxially grown on an upper surface 14 of the substrate 12.

In FIG. 5a, an open cavity 56 of arbitrary shape and depth (typically 2–25 $\mu$m) can be wet or dry etched into the substrate 12 at a predetermined location of the MEM structure 52. To form a cavity 56 having sloped sidewalls 58 as shown in FIG. 5a, a bulk micromachining process can be used. To form the cavity 56, a hard mask 60 (e.g. 500 nm of TEOS) is first formed over the substrate 12 and patterned by dry etching (e.g. by reactive ion etching through a photoresist mask which is subsequently removed to leave the patterned hard mask in place) to provide an opening through to the substrate at the location of the cavity 56 to be formed. An anisotropic wet etchant such as potassium hydroxide (KOH), tetramethyl ammonium hydroxide (TMAH) or ethylenediamine pyrocatechol (EDP) can then be used to etch away the exposed silicon and terminate etching upon reaching silicon (111) crystalline planes. The anisotropic wet etching step can be timed and the etching stopped upon reaching a predetermined depth for the cavity 56, thereby producing a substantially planar bottom surface 62 for the cavity. Once the cavity 56 has been formed, the hard mask 60 can be stripped with a selective wet etchant comprising HF. Alternately, a cavity 56 having substantially vertical sidewalls can be formed by anisotropic dry etching (e.g. reactive ion etching) through the hard mask 60.

After the hard mask 60 is removed, a thin blanket layer of a few hundred nanometers of a thermal oxide (not shown) can be formed over the entire substrate 12 including the cavity 56 by a conventional wet oxidation process as described previously. A first silicon nitride layer 64 can then be deposited to blanket the upper surface 14 and line the cavity 56 as shown in FIG. 5b. The first silicon nitride layer 64 can also blanket a lower surface of the substrate 12 (not shown). The first nitride layer 64 is preferably formed by LPCVD and can be used as a polishing stop during a later CMP step for globally planarizing the substrate 12. The first nitride layer 64 within the cavity 56 also serves as an etch stop to terminate etching in the cavity 56 during a subsequent etch release step, and also can electrically insulate the MEM structure 52 from the underlying substrate 12.

In FIG. 5c, a first polysilicon layer 16 (i.e. the Poly-0 layer) is deposited in the cavity 56 and patterned to form a voltage reference plane for the MEM structure 52 of the integrated MEM device 50. The Poly-0 layer 16 is preferably doped. The doping can be done by an ion implantation or thermal diffusion step, or by in-situ doping during deposition of the polysilicon layer 16. The layer 16 is patterned (e.g. by reactive ion etching with a plasma including HBr, $SF_6$ or $Cl_2$) and forms electrical interconnections between microelectromechanical elements of the integrated MEM device 50 and is also electrically connected to the electronic circuitry 54.

In FIG. 5d, a first sacrificial layer 18 is deposited over the substrate 12 and in the cavity 56 to a predetermined layer thickness. The first sacrificial layer 18 can comprise either a conventional sacrificial material (e.g. $SiO_2$ or TEOS), or silicon oxynitride as described previously with reference to FIG. 2b. The first sacrificial layer 18 can be patterned by etching to form a plurality of shaped openings 20 therein as shown in FIG. 5d.

In FIG. 5e, a layer of an electrically-insulating material (e.g. silicon nitride) can be deposited into one or more of the openings 20 to form a support 66 for a stationary portion of the MEM structure 52 (e.g. a stationary electrode 112), with a first structural layer 22 of doped polysilicon (i.e. the Poly-1 layer) being deposited in the remaining openings 20. This can be done by a series of masking and deposition steps. Any of the electrically-insulating material or polysilicon deposited outside of the openings 20 can be removed either by etching or by chemical-mechanical polishing.

Chemical-mechanical polishing can be used to locally planarize material within a cavity 56 by the use of a polishing pad that is resilient enough so that the polishing pad will deflect into the cavity 56 sufficiently to bring the polishing slurry containing abrasive particles into contact with the layer of material that is being locally planarized. Examples of polishing pads that are useful for such local planarization within the cavity 56 include pads comprised of polyurethane, polyester felts, or a napped poromeric synthetic materials (e.g. a POLYTEX SUPREME napped poromeric polishing pad manufactured by Rodel Corp.).

In FIG. 5f, a second sacrificial layer 26 is deposited over the substrate 12 and in the cavity 56 and patterned to form a mold comprised of a plurality of shaped openings 20. The second sacrificial layer 26, which has been described previously with reference to FIGS. 2e–2f, can comprise either a conventional sacrificial material (e.g. $SiO_2$ or TEOS), or silicon oxynitride of a particular composition that is either tensile-strained or substantially-stress-free. The second sacrificial layer 26 can be locally planarized within the cavity 56 by CMP when this is needed to provide a substantially planar top surface for patterning of the layer 26 by masking and etching steps.

In FIG. 5g, a second structural layer 32 of doped polysilicon (i.e. the Poly-2 layer) is deposited to fill the mold formed in the second sacrificial layer 26 and build up the MEM structure 52, with any excess polysilicon outside the mold being removed by a localized CMP step, or alternatively by an etching step.

In FIG. 5h, additional sacrificial layers 34 and structural layers of doped polysilicon (including a third structural layer 36 denoted as Poly-3, and a fourth structural layer 38 denoted as Poly-4) are alternately deposited and patterned to build up the MEM structure 52 and to overfill the cavity 56 with sacrificial material, thereby encapsulating the completed MEM structure 52. These additional sacrificial layers 34 preferably include one or more layers of silicon oxynitride to minimize any accumulation of compressive stress within the MEM structure 52.

In the example of FIG. 4, a hinged member 110 (i.e. a proof mass) is formed from layer 36 and is moveable within a gap formed between a pair of stationary electrodes 112 in response to an acceleration or deceleration force, thereby permitting the acceleration or deceleration to be capacitively sensed (e.g. by a capacitance bridge circuit formed by the electrodes 112 in combination with the electronic circuitry 54). To increase the fabrication yield and to provide for proper functioning of the integrated MEM device, it is preferred that the hinged member 110 be formed with minimal residual stress after deposition and annealing. To accomplish this, a substantially-stress-free composition of silicon oxynitride can be used for the sacrificial material for each of the sacrificial layers 34 in contact with the hinged member 110. The composition of the remaining sacrificial layers is less critical so that, for example, the layers 18 and 26 can be formed of a conventional sacrificial material (e.g. $SiO_2$ or TEOS). Additionally, it may be less critical that other elements of the MEM structure 52 such as the stationary electrodes 112 be formed with minimal stress. Furthermore, some elements of the MEM structure 52 (e.g. a silicon nitride support 66) can be comprise materials that cannot be formed substantially-stress-free, even after annealing.

In FIG. 5i, the substrate 12 can be globally planarized by a CMP step down to the first nitride layer 64 which serves as a polishing stop. Alternately, an etch mask can be provided above the cavity 56 so that the sacrificial material beyond the cavity 56 can be removed by selective etching (e.g. with HF) with the underlying first nitride layer 64 acting as an etch stop. The etch mask can then be removed and the remaining sacrificial material above the first nitride layer 64 can be removed by chemical-mechanical polishing.

In FIG. 5i, the individual layers of structural polysilicon are shown connected together to form the hinged member 110 and the stationary electrodes 112. The hinged member 110 can be further electrically connected to the voltage reference plane formed by the Poly-0 layer 16. The various layers of sacrificial material in FIG. 5i are denoted collectively by the numeral 68.

In FIG. 5j, after planarization of the substrate 12, a cap layer 70 (e.g. comprising 100–300 nanometers of LPCVD silicon nitride) can be blanket deposited over the substrate 12 and any exposed portions of the sacrificial material 68 to seal the encapsulated MEM structure 52. After this sealing step has been performed, electronic circuitry 54 can be fabricated on the substrate 12 by conventional methods comprising a plurality of standard process steps with little if any modification (e.g. CMOS, bipolar CMOS or bipolar circuitry). The sealed substrate 12 can even be shipped to a foundry for fabrication of the electronic circuitry 52 by a set of standard process steps.

Prior to fabricating the electronic circuitry 52, a final annealing step can be performed by heating the substrate 12 and encapsulated MEM structure 52 to a preselected temperature in the range of about 700–1300° C., and preferably in the range of 900–1100° C., for a time period of up to about three hours or more depending upon the level of stress to be relieved. Alternately, annealing of the substrate 12 can be performed during a thermal cycle used for fabricating the electronic circuitry 54 (e.g during one or more thermal diffusion steps for forming transistors).

In FIG. 5k, the electronic circuitry 54 can be formed on a portion of the substrate 12 proximate to the MEM structure 52 using a set of standard process steps as known to the art of semiconductor IC fabrication. The electronic circuitry 54 comprises a plurality of interconnected transistors and circuit elements (e.g. resistors and capacitors) formed on the upper surface 14 of the substrate 12 according to a predetermined circuit diagram (e.g. a capacitance bridge circuit) for processing an electrical output signal from the MEM structure 52, or for activating the MEM structure 52. The electronic circuitry 54 can be formed according to a predetermined set of design rules (e.g. 0.5 or 2 $\mu$m design rules to form transistors having a corresponding minimum feature size).

The process for forming the electronic circuitry 54 will be described hereinafter with reference to a preferred process for forming CMOS circuitry. However, it will be understood by those skilled in the art that the electronic circuitry 54 can also be formed as bipolar complementary metal-oxide semiconductor (BiCMOS) circuitry or bipolar circuitry using a set of conventional process steps well-known in the art. Additionally, the formation of integrated electronic circuitry (e.g. CMOS, BiCMOS or bipolar electronic circuitry) can comprise up hundreds of individual steps which are well-known in the art and which have been standardized in the integrated circuit (IC) industry. Therefore, for clarity, only a few steps that are relevant to the present invention are discussed herein in detail.

To begin formation of the CMOS electronic circuitry 54, the cap layer 70 can be completely removed and the first nitride layer 64 can be locally removed, thereby exposing the upper surface 14 in a portion of the substrate 12 reserved for the electronic circuitry 54. A thermal oxide layer comprising about 30–40 nanometers of silicon dioxide can then be formed by a thermal diffusion process whereby silicon at the upper surface 14 of the substrate 12 is converted into silicon dioxide. The substrate 12 can then be masked so that the sacrificial material in the cavity 56 can be dry etched to form a well at each location where an electrical connection is to be made to the MEM structure 52.

A new silicon nitride layer 72 (termed herein a second silicon nitride layer) of, for example, about 120 nanometers thickness can then be blanket deposited over the substrate 12 by plasma-enhanced chemical vapor deposition (PECVD), and patterned to form openings down to the upper surface 14 at the locations of a plurality of n-type transistors 74 and p-type transistors 76 to be formed in the substrate 12 The transistors 74 and 76 can be formed by a set of standard CMOS process steps whereby n-type and p-type isolation wells (also termed tubs) are formed below the upper surface 14 by ion implantation and/or thermal diffusion steps. Subsequently, as shown in FIG. 5k, n-type source and drain regions are formed within the p-type wells at the locations of n-type transistors 74; and p-type source and drain regions are formed within the n-type wells at the locations of p-type transistors 76.

In FIG. 5l, one or more polysilicon layers can be deposited and patterned to form transistor gates 78 and resistors 80. A field oxide layer 82 (e.g. CVD silicon dioxide) can also be deposited and patterned as shown in FIG. 5l to provide electrical isolation between adjacent transistors, and between the transistors and an overlying patterned metallization 86 to be formed subsequently.

In FIG. 5m, one or more passivation layers 84 comprising a silicate glass such as TEOS, plasma-enhanced TEOS (also termed PETEOS), phosphosilicate glass (PSG), borophosphorous silicate glass (also termed BPSG), or combinations thereof can be deposited over the substrate 12 and patterned to provide a plurality of openings for the deposition of the overlying patterned metallization 86. The metallization 86 preferably comprises aluminum or an aluminum alloy, although doped polysilicon or metals such as tungsten, gold, copper, platinum, nickel and palladium or metal alloys including metal silicides can be used alternately, or combination with each other, or in combination with aluminum or an alloy thereof. Openings can be etched through the second nitride layer 72 to allow electrical connections to be made to the MEM structure 52 (e.g. to the hinged member 110 and each of the stationary electrodes 112). The metallization 86 also is used to make electrical connections between the transistors and other circuit elements (e.g. resistors 80), and to bonding or contact pads (not shown). Multiple layers of the patterned metallization 86 can be separated by and overcoated with additional passivation layers 84.

In FIG. 5n, a protection layer 88 can be deposited to cover the electronic circuitry 54 and the interconnect metallization 86 for use during an etch release step whereby the various layers of sacrificial material 68 are removed, at least in part, by a selective etchant comprising hydrofluoric acid (HF). The protection layer 88 can comprise any material that is substantially chemically resistant to attack by HF, including photoresist, polyimide, silicon nitride (e.g. deposited by PECVD), or tungsten. A photoresist, polyimide or silicon nitride protection layer 88 can be used when the selective etchant comprises a buffered oxide etchant; whereas a protection layer 88 comprising tungsten is preferred when the selective etchant comprises a more aggressive etchant such as a mixture of HF and hydrochloric acid (HCl) or a mixture of HF and water ($H_2O$). The selective etchant can also comprise HF in a vapor form. The exact proportions of the constituents in each mixture can be adjusted to provide a predetermined etching rate for selectively removing the sacrificial layers 68 while not substantially attacking the silicon substrate 12 or the protected electronic circuitry 54.

A tungsten protection layer 88 can be formed after initially depositing a thin passivation layer 90 (e.g. about 200 nanometers of a silicate glass such as PETEOS) to cover the electronic circuitry 54. The tungsten protection layer 88 preferably includes an adhesion layer comprising about 50 nanometers of titanium nitride (TiN) deposited by sputtering or CVD over the electronic circuitry 54. A thicker layer (e.g. about 0.1–1 microns thick) of tungsten (W) is then deposited over the titanium nitride layer (e.g. by CVD using $WF_6$ as a source gas). This forms a two-ply protection layer 88 which has a substantial chemical resistance to the HF:HCl or HF:$H_2O$ selective etchants to prevent any damage to the electronic circuitry 54 during removal of the sacrificial material 68. After removal, at least in part, of the sacrificial material 68, the tungsten-based protection layer 88 can be removed using another selective etchant comprising hydrogen peroxide.

After formation of the protection layer 88 in FIG. 5n, the protection layer can be overcoated with a thin layer (about 100 nanometers) of PECVD silicon dioxide or silicate glass (e.g. TEOS) to improve adhesion for a subsequently-formed photoresist layer (not shown). This photoresist layer can be photolithographically patterned and used to etch away all the exposed second silicon nitride layer 72 covering the MEM structure 52 to expose the sacrificial material 68 for etching by the selective etchant comprising HF. Alternately, as shown in FIG. 5o, a plurality of typically micron-sized openings or channels 92 can be etched down through the second silicon nitride layer 72 to expose the sacrificial material 68 for removal by etching.

In FIG. 5p, an etch release step can be performed to partially or completely remove the sacrificial material 68 from the cavity 56 by etching with a selective etchant (e.g. comprising HF), thereby freeing the moveable member (i.e. hinged member 110) and allowing for movement thereof. The etch release step removes the sacrificial material 68 by etching downward and laterally outward from each channel 92. The etch release step can be timed to leave some of the sacrificial material 68 in the cavity to help support or anchor particular elements of the MEM structure 52. Alternately, the sacrificial material 68 can be completely removed during the etch release step by using a prolonged etch time (e.g. for several hours).

After the etch release step, the substrate 12 can be washed and dried. In FIG. 5q, the channels 92 can optionally be plugged to form a sealed-cavity integrated MEM device 50. This can be done by plugging the channels 92 with deposited PECVD silicon nitride plugs 94 as shown in FIG. 5q, or alternately with sputtered or evaporated metal. This step can be performed in a deposition chamber to provide a predetermined level of vacuum or pressure within the cavity 56. After the etch release step, the protection layer 88 can be optionally removed entirely or in part (e.g. at the locations of bonding pads). The completed device 50 can then be packaged for use.

Other applications and variations of the method of the present invention will become evident to those skilled in the art. The actual scope of the invention is intended to be defined in the following claims when viewed in their proper perspective based on the prior art.

what is claimed is:

1. A method for forming a microelectromechanical (MEM) apparatus having at least one substantially stress-free moveable member, comprising steps for:
   a) forming the member by depositing and patterning at least one layer of polysilicon on a substrate;
   b) encapsulating the member within a sacrificial material comprising silicon oxynitride having an index of refraction at 633 nanometers within the range of 1.5–1.7;

c) annealing the substrate, thereby relieving any stress within the member; and d) releasing the member for movement by removing at least a part of the sacrificial material.

2. The method of claim 1 wherein the step for forming the member comprises depositing each layer of polysilicon by low-pressure chemical vapor deposition.

3. The method of claim 1 wherein the step for forming the member comprises depositing each layer of polysilicon by rapid-thermal chemical vapor deposition.

4. The method of claim 1 wherein the step for forming the member comprises forming the member above an upper surface of the substrate.

5. The method of claim 1 wherein the step for forming the member comprises forming the member within a cavity etched into the substrate.

6. The method of claim 1 wherein the step for forming the member comprises patterning the member by etching.

7. The method of claim 1 wherein the step for forming the member comprises:

depositing a layer of the sacrificial material over the substrate;

patterning the layer of sacrificial material and forming a shaped mold therein; and depositing polysilicon into the mold.

8. The method of claim 7 further including a step for removing at least a portion of any polysilicon deposited over the substrate outside the mold.

9. The method of claim 1 wherein the step for encapsulating the member with the sacrificial material comprises depositing at least one layer of silicon oxynitride having an index of refraction at 633 nanometers within the range of 1.5–1.6.

10. The method of claim 1 wherein the step for encapsulating the member with the sacrificial material comprises depositing at least one layer of silicon oxynitride having a residual stress of less than or equal to 0.5 gigaPascals (GPa).

11. The method of claim 10 wherein the silicon oxynitride layer has a residual stress of less than or equal to 0.25 gigaPascals (GPa).

12. The method of claim 1 wherein the step for annealing the substrate comprises annealing the substrate at an elevated temperature in the range of 700–1300° C.

13. The method of claim 12 wherein the annealing step is performed at the elevated temperature for a time period of 1–10 hours.

14. The method of claim 1 further including steps for fabricating electronic circuitry comprising a plurality of transistors on the substrate, with the electronic circuitry being electrically connected to the moveable member.

15. The method of claim 14 wherein the steps for fabricating the electronic circuitry on the substrate are performed after the annealing step.

16. The method of claim 1 wherein the step for releasing the member for movement comprises selectively removing the sacrificial material by etching with a selective etchant comprising hydrofluoric acid.

17. A method for forming a microelectromechanical (MEM) apparatus, comprising steps for:

(a) depositing and patterning a plurality of layers of polysilicon to form at least one moveable member of the MEM apparatus;

(b) depositing a sacrificial material comprising silicon oxynitride for separating at least one pair of the plurality of layers of polysilicon;

(c) annealing the layers of polysilicon and sacrificial material; and (d) removing, at least in part, the sacrificial material to release the MEM apparatus for operation.

18. The method of claim 17 wherein the step for depositing the layers of polysilicon comprises depositing the layers of polysilicon on a substrate by low-pressure chemical vapor deposition or rapid-thermal chemical vapor deposition.

19. The method of claim 17 wherein the step for patterning the layers of polysilicon comprises steps for masking and etching the layers of polysilicon.

20. The method of claim 17 wherein the step for patterning the layers of polysilicon comprises depositing a layer of the sacrificial material; patterning the layer of sacrificial material and forming a shaped mold therein; and depositing polysilicon into the mold.

21. The method of claim 17 wherein the step for depositing the sacrificial material comprises depositing silicon oxynitride having an index of refraction at 633 nanometers in the range of 1.5–1.7.

22. The method of claim 21 wherein the step for depositing the sacrificial material comprises depositing silicon oxynitride having an index of refraction at 633 nanometers in the range of 1.5–1.6.

23. The method of claim 17 wherein the step for depositing the sacrificial material comprises depositing silicon oxynitride having a residual stress of less than or equal to 0.5 gigaPascals (GPa).

24. The method of claim 23 wherein the step for depositing the sacrificial material comprises depositing silicon oxynitride having a residual stress of less than or equal to 0.25 gigaPascals (GPa).

25. The method of claim 17 wherein the step for annealing the substrate comprises annealing the substrate at an elevated temperature in the range of 700–1300° C.

26. The method of claim 25 wherein the annealing step is performed at the elevated temperature for up to several hours.

27. The method of claim 17 further including steps for fabricating electronic circuitry comprising a plurality of transistors on the substrate, with the electronic circuitry being electrically connected to the moveable member.

28. The method of claim 27 wherein the steps for fabricating the electronic circuitry on the substrate are performed after the annealing step.

29. The method of claim 17 wherein the step for removing, at least in part, the sacrificial material comprises removing the sacrificial material by etching with a selective etchant.

30. A method for forming a microelectromechanical (MEM) apparatus, comprising steps for:

(a) building up a microelectromechanical structure of the MEM apparatus by depositing and patterning alternating layers of polysilicon and a sacrificial material comprising silicon oxynitride, with the silicon oxynitride having a composition selected to be substantially stress-free;

(b) annealing the structure for substantially relieving stress within the polysilicon layers, and (c) releasing the structure for operation of the MEM apparatus by removing at least a part of the silicon oxynitride sacrificial material.

31. The method of claim 30 wherein the step for building up the microelectromechanical microelectromechanical structure comprises building up the structure above an upper surface of a substrate.

32. The method of claim 30 wherein the step for building up the microelectromechanical structure comprises building up the structure within a cavity formed in a substrate.

33. The method of claim 30 wherein the step for building up the microelectromechanical structure comprises depositing the alternating layers of polysilicon and silicon oxynitride sacrificial material by a deposition method selected from the group consisting of low-pressure chemical vapor deposition, rapid-thermal chemical vapor deposition, plasma-enhanced chemical vapor deposition, and combinations thereof.

34. The method of claim 30 wherein the step for building up the microelectromechanical structure comprises patterning the alternating layers of polysilicon and silicon oxynitride by masking and etching at least one layer of each pair of alternating layers of polysilicon and silicon oxynitride.

35. The method of claim 34 wherein a first layer of the pair of alternating layers of polysilicon and silicon oxynitride is etched to form a shaped mold, and a second layer of the pair is patterned by depositing the second layer to fill the shaped mold.

36. The method of claim 35 further including a step for removing a portion of the second layer that is outside of the shaped mold.

37. The method of claim 30 wherein the step for building up the microelectromechanical structure includes a step for planarizing at least one layer of each pair of the alternating layers of polysilicon and silicon oxynitride.

38. The method of claim 37 wherein the planarization step comprises chemical-mechanical polishing.

39. The method of claim 30 wherein the step for depositing the sacrificial material comprises depositing silicon oxynitride having an index of refraction at 633 nanometers in the range of 1.5 to 1.6.

40. The method of claim 30 wherein the step for depositing the sacrificial material comprises depositing silicon oxynitride having a residual stress of less than or equal to 0.25 gigaPascals (GPa).

41. The method of claim 30 wherein the annealing step is performed at an elevated temperature in the range of 700–1300° C. for a time period of 1–10 hours.

42. The method of claim 30 wherein the microelectromechanical structure is built up on a substrate, and further including steps for fabricating electronic circuitry comprising a plurality of transistors on the substrate, with the electronic circuitry being electrically connected to the microelectromechanical structure.

43. The method of claim 42 wherein the steps for fabricating the electronic circuitry on the substrate are performed after the annealing step.

44. The method of claim 43 wherein the electronic circuitry comprises an aluminum or aluminum alloy interconnect metallization.

45. The method of claim 30 wherein the step for releasing the structure for operation comprises removing at least a part of the sacrificial material by etching with a selective etchant comprising hydrofluoric acid.

46. A method for forming a microelectromechanical (MEM) apparatus having at least four layers of structural polysilicon, comprising steps for:
(a) depositing a layer of sacrificial material comprising silicon oxynitride between the third and fourth layers of structural polysilicon;
(b) annealing the layers of structural polysilicon and silicon oxynitride for reducing any stress in the polysilicon layers; and
(c) removing at least a part of each sacrificial layer, thereby releasing the structural polysilicon layers for movement.

47. The method of claim 46 wherein the silicon oxynitride sacrificial material has an index of refraction at 633 nanometers in the range of 1.5–1.7.

48. The method of claim 46 wherein the silicon oxynitride sacrificial material is deposited to provide a residual stress of less than or equal to 0.5 gigaPascals (GPa).

49. The method of claim 46 wherein the silicon oxynitride sacrificial material is substantially-stress-free.

50. A method for forming a microelectromechanical (MEM) apparatus having at least four layers of structural polysilicon wherefrom moveable members are formed, comprising steps for:
(a) depositing a layer of sacrificial material comprising silicon oxynitride between each adjacent pair of the layers of structural polysilicon;
(b) annealing the layers of structural polysilicon and silicon oxynitride for reducing any stress in the polysilicon layers; and
(c) removing at least a part of each sacrificial layer, thereby releasing the structural polysilicon layers for movement.

51. The method of claim 50 wherein the silicon oxynitride layer has a composition providing an index of refraction at 633 nanometers in the range of 1.5–1.7.

52. The method of claim 50 wherein the silicon oxynitride layer has a residual stress of less than or equal to 0.5 gigaPascals (GPa).

53. The method of claim 50 wherein the silicon oxynitride layer is substantially-stress-free.

54. A method for improving the reliability of a microelectromechanical (MEM) apparatus by minimizing residual stress within a polysilicon member thereof, comprising steps for:
(a) depositing a polysilicon layer upon a first layer of substantially-stress-free silicon oxynitride and patterning the polysilicon layer to form the polysilicon member;
(b) depositing a second layer of substantially-stress-free silicon oxynitride over the polysilicon member, thereby encapsulating the polysilicon member;
(c) annealing the polysilicon member for reducing any stress therein; and
(d) removing at least a part of the first and second layers of silicon oxynitride for releasing the polysilicon member.

55. The method of claim 54 wherein the steps for depositing the first and second layers of silicon oxynitride comprise depositing the silicon oxynitride with a composition selected to provide an index of refraction at 633 nanometers in the range of 1.5–1.6.

56. The method of claim 54 wherein the steps for depositing the first and second layers of silicon oxynitride comprise depositing the silicon oxynitride with a composition selected to provide an absolute value of residual stress that is less than or equal to 0.25 gigaPascals (GPa).

57. A method for maintaining wafer planarity during formation of a plurality of microelectromechanical (MEM) devices on a substrate, comprising steps for:
(a) depositing and patterning a plurality of polysilicon layers on the wafer for forming an microelectromechanical structure of each MEM device; and
(b) depositing a sacrificial material comprising silicon oxynitride between adjacent of the plurality of polysilicon layers, the silicon oxynitride having a composition selected to be tensile-strained or substantially-stress-free.

58. The method of claim 57 wherein the step of depositing the sacrificial material comprises depositing silicon oxynitride with an index of refraction at 633 nanometers in the range of 1.5–1.7.

59. The method of claim 57 wherein the step of depositing the sacrificial material comprises depositing tensile-strained silicon oxynitride with a residual tensile stress of less than or equal to 0.5 gigaPascals (GPa).

60. The method of claim 57 wherein the step of depositing the sacrificial material comprises depositing substantially-stress-free silicon oxynitride having an absolute value of residual stress that is less than or equal to 0.25 gigaPascals (GPa).

61. The method of claim 57 further including a step for annealing the wafer for relieving any stress within the polysilicon layers.

62. The method of claim 57 further including a step for removing at least a part of the sacrificial material for releasing the microelectromechanical structure for operation.

* * * * *